(12) United States Patent
Bang et al.

(10) Patent No.: US 12,490,606 B2
(45) Date of Patent: Dec. 2, 2025

(54) DISPLAY DEVICE

(71) Applicant: Samsung Display Co., LTD., Yongin-si (KR)

(72) Inventors: Ki Ho Bang, Yongin-si (KR); Won Suk Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 430 days.

(21) Appl. No.: 18/129,261

(22) Filed: Mar. 31, 2023

(65) Prior Publication Data
US 2024/0040867 A1 Feb. 1, 2024

(30) Foreign Application Priority Data

Jul. 27, 2022 (KR) .......................... 10-2022-0093241
Aug. 11, 2022 (KR) .......................... 10-2022-0100649

(51) Int. Cl.
*H10K 59/131* (2023.01)
(52) U.S. Cl.
CPC .................................. *H10K 59/131* (2023.02)
(58) Field of Classification Search
CPC ................................................... H10K 59/131
See application file for complete search history.

(56) References Cited

U.S. PATENT DOCUMENTS 11,538,420 B2 * 12/2022 Kwak .................. G09G 3/3275
2021/0233445 A1 * 7/2021 Gao ........................ G09G 3/006

FOREIGN PATENT DOCUMENTS

| KR | 1020200143558 | 12/2020 |
| KR | 1020210008201 | 1/2021 |
| KR | 1020210010686 | 1/2021 |
| KR | 1020220017461 | 2/2022 |

* cited by examiner

*Primary Examiner* — Douglas M Menz
(74) *Attorney, Agent, or Firm* — CANTOR COLBURN LLP

(57) ABSTRACT

A display device includes a circuit array layer including a plurality of pixel drivers, data lines, and demux circuits disposed in a demux area of the non-display area, where the demux area is disposed adjacent to the subsidiary area, and a display driver circuit which supplies data driving signals associated with the data lines. A second data input line, which is electrically connected to a second demux circuit disposed in a second demux area of the demux area being a side area of the demux area in a first direction, includes a main input line; a demux detour line disposed in the display area and electrically connected to the main input line; and a detour additional line electrically connected between the demux detour line and an input terminal of the second demux circuit.

28 Claims, 21 Drawing Sheets

SEL: CHDT, SDT, DDT, CH1-1, S1-1, D1-1, CH1-2, S1-2, D1-2,
CH2, S2, D2, CH3-1, S3-1, D3-1, CH3-2, S3-2, D3-2,
CH4, S4, D4, CH5, S5, D5, CH6, S6, D6
CDL1: GWL, GIL, ECL, GCL, GDT, G1-1, G1-2, G2, G3-1, G3-2, G4, G5, G6
CDL2: VDSBL1, VGIL, VAIL, SHE
CDL3: VDSBL2, VGIAL, VAIAL, CE1, CE2, CE3
VDL: VDSBL1, VDSBL2

DMC: DMC1, DMC2, DMC3
DIPL: DIPL1, DIPL2, DIPL3
DMOL: DMOL1, DMOL2

DMC: DMC1, DMC2, DMC3
DIPL: DIPL1, DIPL2, DIPL3
DMOL: DMOL1, DMOL2, DMOL3

DISPLAY DEVICE

This application claims priority to Korean Patent Application No. 10-2022-0093241, filed on Jul. 27, 2022, and Korean Patent Application No. 10-2022-0100649, filed on Aug. 11, 2022, and all the benefits accruing therefrom under 35 U.S.C. § 119, the contents of which in their entireties are herein incorporated by reference.

BACKGROUND

1. Field

The disclosure relates to a display device.

2. Description of the Related Art

As the information-oriented society evolves, various demands for display devices are ever increasing. For example, a variety of electronic devices, such as smart phones, digital cameras, laptop computers, navigation devices, and smart televisions, are employing display devices.

The display device may include a display panel that emits light for displaying images, and a driver that supplies a signal or power for driving the display panel.

At least one surface of the display device may be referred to as a display surface on which images are displayed. The display surface may include a display area in which emission areas for emitting lights to display images are arranged, and a non-display area surrounding the display area.

Such a display device may include data lines disposed in the display area to transmit data signals to the emission areas, and a display driver circuit to supply the data signals to the data lines.

SUMMARY

Since signal transmission lines between data lines and a display driver circuit are disposed in the non-display area, the width of the non-display area may increase as the number of the data lines increases to improve the resolution.

On the other hand, if the width of the non-display area is reduced to increase the ratio of the display area on the display surface, it may be difficult to arrange the signal transmission lines with sufficient distances which is determined to avoid short-circuit and the like. Accordingly, since the number of signal transmission lines that can be arranged in the non-display area is limited to a certain number, it may be difficult to improve the resolution of the display device.

Embodiments of the disclosure provide a display device that can reduce the width of the non-display area without compromising the resolution.

According to an embodiment, a display device includes a substrate including a main area and a subsidiary area protruding from one side of the main area, where the main area includes a display area in which a plurality of emission areas is arranged in a first direction and a second direction, and a non-display area disposed around the display area; a circuit array layer disposed on the substrate and including a plurality of pixel drivers associated with the plurality of emission areas, respectively, data lines which transmits data signals to the plurality of pixel drivers, and demux circuits disposed in a demux area of the non-display area, where the demux area is disposed adjacent to the subsidiary area; and a display driver circuit disposed in the subsidiary area of the substrate, where the display driver circuit supplies data driving signals associated with the data lines. In such an embodiment, one demux circuit of the demux circuits outputs two or more data signals based on one data driving signal of the data driving signals supplied by the display driver circuit. In such an embodiment, the demux circuits include a first demux circuit disposed in a first demux area of the demux area which is adjacent to the subsidiary area, and a second demux circuit disposed in a second demux area of the demux area which is adjacent to one side of the first demux area in the first direction. In such an embodiment, the circuit array layer further includes a first data input line extending from the subsidiary area to the first demux area and electrically connected to an input terminal of the first demux circuit; and a second data input line electrically connected to an input terminal of the second demux circuit. In such an embodiment, the second data input line includes a main input line extending from the subsidiary area to the first demux area; a demux detour line disposed in the display area and electrically connected to the main input line; and a detour additional line disposed in the second demux area and electrically connected between the demux detour line and an input terminal of the second demux circuit.

In an embodiment, the display area may include a demux adjacent area which is adjacent to the demux area. In such an embodiment, the demux detour line may include a first detour line disposed in a center adjacent area of the demux adjacent area which is adjacent to the first demux area, where the first detour line is electrically connected to the main input line and extending in the second direction; a second detour line electrically connected to the first detour line and extending in the first direction; and a third detour line disposed in an edge adjacent area of the demux adjacent area which is located between the center adjacent area and the non-display area and adjacent to the second demux area, where the third detour line is extending in the second direction toward the second demux area, and electrically connected between the second detour line and the detour additional line.

In an embodiment, the detour additional line may be extending in the second direction.

In an embodiment, the detour additional line may include a first extended portion electrically connected to the third detour line and extending in the second direction; and a second extended portion electrically connected between the first extended portion and the input terminal of the second demux circuit and extending in the first direction.

In an embodiment, the subsidiary area may include a bending area bendable into a bent shape, a first subsidiary area disposed between the main area and one side of the bending area, and a second subsidiary area on an opposite side of the bending area. In such an embodiment, the circuit array layer may further include a first data supply line and a second data supply line, which are disposed in the second subsidiary area and electrically connected to output terminals of the display driver, respectively; a first data bending line electrically connected between the first data supply line and the first data input line and disposed in the bending area; and a second data bending line electrically connected between the second data supply line and the main input line and disposed in the bending area.

In an embodiment, the display device may further include a light-emitting element array layer disposed on the circuit array layer and including a plurality of light-emitting elements associated with the plurality of emission areas, respectively. In such an embodiment, the data lines may be extending in the second direction. In such an embodiment, the circuit array layer may further include a first voltage supply line and a second voltage supply line which are disposed in the non-display area and transmit first and second voltages, respectively, for driving the light-emitting elements; and a second voltage auxiliary line disposed in the display area and extending in the second direction to be electrically connected to the second voltage supply line, and where a part of each of the first voltage supply line and the second voltage supply line overlaps with the demux circuits.

In an embodiment, one data line of two or more data lines, which are disposed in the center adjacent area and electrically connected to the first demux circuit, may be disposed adjacent to the first detour line. In such an embodiment, another data line of the two or more data lines may be disposed adjacent to the second voltage auxiliary line.

In an embodiment, one data line of two or more data lines which are disposed in the edge adjacent area and electrically connected to the second demux circuit, may be disposed adjacent to the third detour line. In such an embodiment, another data line of the two or more data lines may be disposed adjacent to the second voltage auxiliary line.

In an embodiment, the center adjacent area may include a middle area and a side area between the middle area and the edge adjacent area. In such an embodiment, the first demux circuit may be disposed in a portion of the first demux area which is adjacent to the side area. In such an embodiment, the demux circuits may further include a third demux circuit disposed in other portion of the first demux area which is adjacent to the middle area. In such an embodiment, each of two or more data lines disposed in the middle area and electrically connected to the third demux circuit may be disposed adjacent to the second voltage auxiliary line.

In an embodiment, the circuit array layer further include a first voltage auxiliary line disposed in the display area, extending in the first direction, and electrically connected to the first voltage supply line; and a second voltage sub-line disposed in a general area of the display area which is the rest of the display area except for the demux adjacent area, extending in the first direction and electrically connected to the second voltage supply line. In such an embodiment, the first voltage auxiliary line may be disposed adjacent to the second detour line in the demux adjacent area, and disposed adjacent to the second voltage sub-line in the general area.

In an embodiment, the circuit array layer may further include first dummy lines respectively aligned with the first detour line and the third detour line, respectively spaced apart from one side of the first detour line in the second direction and one side of the third detour line in the second direction, and extending in the second direction; and second dummy lines aligned with the second detour line, respectively spaced apart from opposing sides of the second detour line in the first direction, and extending in the first direction.

In an embodiment, the first dummy lines or the second dummy lines may be electrically connected to the second voltage supply line.

In an embodiment, the circuit array layer may include a semiconductor layer on the substrate; a first conductive layer on a first gate dielectric layer covering the semiconductor layer; a second conductive layer on a second gate dielectric layer covering the first conductive layer; a third conductive layer on an interlayer dielectric layer covering the second conductive layer; a fourth conductive layer on a first planarization layer covering the third conductive layer; a fifth conductive layer on a second planarization layer covering the fourth conductive layer; and a third planarization layer covering the fifth conductive layer. In such an embodiment, the data lines, the first detour line, the third detour line, the second voltage auxiliary line, and the first dummy lines may be defined by the fifth conductive layer. In such an embodiment, the second detour line, the first voltage auxiliary line, the second dummy lines, and the second voltage sub-line may be defined by the fourth conductive layer.

In an embodiment, each of the demux circuits may include two or more demux transistors. In such an embodiment, gate electrodes of the two or more demux transistors may be electrically connected to two or more demux control lines, respectively. In such an embodiment, the two or more demux control lines may supply demux control signals of different phases from each other.

In an embodiment, the light-emitting array layer may include a plurality of anode electrodes disposed on the third planarization layer, associated with the plurality of emission areas, respectively, and electrically connected to the plurality of pixel drivers, respectively; a pixel-defining layer disposed on the third planarization layer, associated with a non-emission area which is an area between the emission areas, and covering edges of the plurality of anode electrodes; a plurality of emission material layers associated with the emission areas, respectively, and disposed on the anode electrodes, respectively; and a cathode electrode associated with the plurality of emission areas and disposed on the pixel-defining layer and the emission material layers and electrically connected to the second voltage supply line. In such an embodiment, each of the light-emitting elements may include an anode electrode and a cathode electrode facing each other, and an emission material layer disposed between the anode electrode and the cathode electrode.

According to an embodiment, a display device includes a substrate including a main area and a subsidiary area protruding from one side of the main area, where the main area includes a display area in which a plurality of emission areas is arranged in a first direction and a second direction, and a non-display area disposed around the display area; a circuit array layer disposed on the substrate and including a plurality of pixel drivers associated with the plurality of emission areas, respectively, data lines which transmit data signals to the plurality of pixel drivers, and demux circuits disposed in a demux area of the non-display area which is adjacent to the subsidiary area; a display driver circuit disposed in the subsidiary area of the substrate, where the display driver circuit supplies data driving signals associated with the data lines; and a light-emitting array layer disposed on the circuit array layer and including a plurality of light-emitting elements associated with the emission areas, respectively. In such an embodiment, one demux circuit among the demux circuits outputs two or more data signals based on one data driving signal. In such an embodiment, the circuit array layer further includes a first voltage supply line and a second voltage supply line which are disposed in the non-display area and transmit first and second voltages for driving the light-emitting elements, respectively. In such an embodiment, a portion of each of the first voltage supply line and the second voltage supply line overlaps with the demux circuits.

In an embodiment, the demux circuits may include a first demux circuit disposed in a first demux area adjacent to the subsidiary area, and a second demux circuit disposed in a second demux area adjacent to one side of the first demux area in the first direction. In such an embodiment, the circuit array layer may further include a first data input line extending from the subsidiary area to the first demux area and electrically connected to an input terminal of the first demux circuit; and a second data input line electrically connected to an input terminal of the second demux circuit.

In such an embodiment, the second data input line may include a main input line extending from the subsidiary area to the first demux area; a demux detour line disposed in the display area and electrically connected to the main input line; and a detour additional line disposed in the second demux area and electrically connected between the demux detour line and the input terminal of the second demux circuit.

In an embodiment, the display area may include a demux adjacent area which is adjacent to the demux area. In such an embodiment, the demux detour line may include a first detour line disposed in a center adjacent area of the demux adjacent area which is adjacent to the first demux area, electrically connected to the main input line and extending in the second direction; a second detour line electrically connected to the first detour line and extending in the first direction; and a third detour line disposed in an edge adjacent area of the demux adjacent area which is located between the center adjacent area and the non-display area and adjacent to the second demux area, extending in the second direction toward the second demux area, and electrically connected between the second detour line and the detour additional line.

In an embodiment, the detour additional line may be extending in the second direction.

In an embodiment, the detour additional line may include a first extended portion electrically connected to the third detour line and extending in the second direction; and a second extended portion electrically connected between the first extended portion and the input terminal of the second demux circuit and extending in the first direction.

In an embodiment, the circuit array layer may further include a second voltage auxiliary line disposed in the display area, extending in the second direction, and electrically connected to the second voltage supply line. In such an embodiment, one of two or more data lines disposed in the center adjacent area and electrically connected to the first demux circuit may be disposed adjacent to the first detour line. In such an embodiment, another one of the two or more data lines may be disposed adjacent to the second voltage auxiliary line.

In an embodiment, the circuit array layer may further include: a second voltage auxiliary line disposed in the display area, extending in the second direction, and electrically connected to the second voltage supply line. In such an embodiment, one of two or more data lines disposed in the edge adjacent area and electrically connected to the second demux circuit may be disposed adjacent to the third detour line. In such an embodiment, another one of the two or more data lines may be disposed adjacent to the second voltage auxiliary line.

In an embodiment, the circuit array layer may further include a second voltage auxiliary line disposed in the display area, extending in the second direction, and electrically connected to the second voltage supply line; a first voltage auxiliary line disposed in the display area, extending in the first direction, and electrically connected to the first voltage supply line; and a second voltage sub-line disposed in a general area of the display area, which is the remaining area of the display area expect for the demux adjacent area, extending in the first direction, and electrically connected to the second voltage supply line. In such an embodiment, the first voltage auxiliary line may be disposed adjacent to the second detour line in the demux adjacent area, and disposed adjacent to the second voltage sub-line in the general area.

In an embodiment, the circuit array layer may further include first dummy lines respectively aligned with the first detour line and the third detour line, respectively spaced apart from one side of the first detour line in the second direction and one side of the third detour line in the second direction, and extending in the second direction; and second dummy lines aligned with the second detour line, respectively spaced apart from opposing sides of the second detour line in the first direction, and extending in the first direction.

In an embodiment, the first dummy lines or the second dummy lines may be electrically connected to the second voltage supply line.

In an embodiment, the circuit array layer may include a semiconductor layer on the substrate; a first conductive layer on a first gate dielectric layer covering the semiconductor layer; a second conductive layer on a second gate dielectric layer covering the first conductive layer; a third conductive layer on an interlayer dielectric layer covering the second conductive layer; a fourth conductive layer on a first planarization layer covering the third conductive layer; a fifth conductive layer on a second planarization layer covering the fourth conductive layer; and a third planarization layer covering the fifth conductive layer. In such an embodiment, the data lines, the first detour line, the third detour line, the second voltage auxiliary line, and the first dummy lines may be defined by the fifth conductive layer. In such an embodiment, the second detour line, the first voltage auxiliary line, the second dummy lines, and the second voltage sub-line may be defined by the fourth conductive layer.

In an embodiment, the light-emitting array layer may include a plurality of anode electrodes disposed on the third planarization layer, associated with the plurality of emission areas, respectively, and electrically connected to the plurality of pixel drivers, respectively; a pixel-defining layer disposed on the third planarization layer, associated with a non-emission area between the emission areas and covering edges of the plurality of anode electrodes; a plurality of emission material layers associated with the emission areas, respectively, and disposed on the anode electrodes, respectively; and a cathode electrode associated with the plurality of emission areas and disposed on the pixel-defining layer and the emission material layers and electrically connected to the second voltage supply line. In such an embodiment, each of the light-emitting elements may include an anode electrode and a cathode electrode facing each other and an emission material layer between the anode electrode and the cathode electrode.

In an embodiment, the subsidiary area may include a bending area bendable into a bent shape, a first subsidiary area disposed between the main area and one side of the bending area, and a second subsidiary area on an opposite side of the bending area. In such an embodiment, the circuit array layer may further include a first data supply line and a second data supply line, which are disposed in the second subsidiary area and electrically connected to output terminals of the display driver, respectively; a first data bending line electrically connected between the first data supply line and the first data input line and disposed in the bending area; and a second data bending line electrically connected between the second data supply line and the main input line and disposed in the bending area.

According to an embodiment of the disclosure, the display device includes data lines that transmit data signals to a plurality of pixel drivers associated with a plurality of emission areas, respectively, a circuit array layer including demux circuits disposed in a demux area of a non-display area that is adjacent to a subsidiary area, and a display driver circuit that supplies data driving signals associated with data lines. In such an embodiment, each of the demux circuits outputs two or more data signals based on one data driving signal.

In an embodiment of the invention, the display device includes the demux circuits connected between the display driver circuit and the data lines, and thus the output terminals of the display driver are not directly connected to the data lines but are connected to the demux circuits which are fewer than the data lines. Therefore, the number of data supply lines connected to the output terminals of the display driver circuit and the number of data bending lines connected to the data supply lines may be smaller than the number of the data lines, so that the width of the non-display area can be reduced. Alternatively, the distance between the data bending lines disposed in the bending area may be increased or the width of the data bending lines disposed in the bending area may be increased.

Accordingly, since the width of the non-display area can be reduced even without reducing the number of the data lines, the resolution can be improved regardless of the reduced width of the non-display area.

In addition, according to an embodiment, a part of each of a first voltage supply line and a second voltage supply line may overlap with the demux circuits of the demux area. Accordingly, since the width of the non-display area is not increased as much as the width of the demux area, it is possible to prevent the width of the non-display area from being greatly increased even though the non-display area includes the demux area.

In addition, according to an embodiment, the demux circuits include a first demux circuit disposed in a first demux area adjacent to the subsidiary area, and a second demux circuit disposed in a second demux area adjacent to one side of the first demux area in the first direction. The first data input line connected to the input terminal of the first demux circuit may be extending from a first subsidiary area to the first demux area. The second data input line connected to the input terminal of the second demux circuit includes a main input line extending from the first subsidiary area to the first demux area, a demux detour line disposed in the display area, and a detour additional line disposed in the second mux area.

In such an embodiment, the second data input line is not extending from the first subsidiary area to the second demux area but reaches the second demux area via the first demux area and the display area from the first subsidiary area.

In such an embodiment, since the second data input line is not extending from the first subsidiary area to the second demux areas, the second data input line is not disposed in the second demux area, and thus the width of the second demux area including the parts bent along the corners of the substrate can be reduced. Therefore, the width of the non-display area can be further reduced.

BRIEF DESCRIPTION OF THE DRAWINGS

The above and other features of embodiments of the disclosure will become more apparent by describing in detail embodiments thereof with reference to the accompanying drawings, in which.

DETAILED DESCRIPTION

Figure 1:
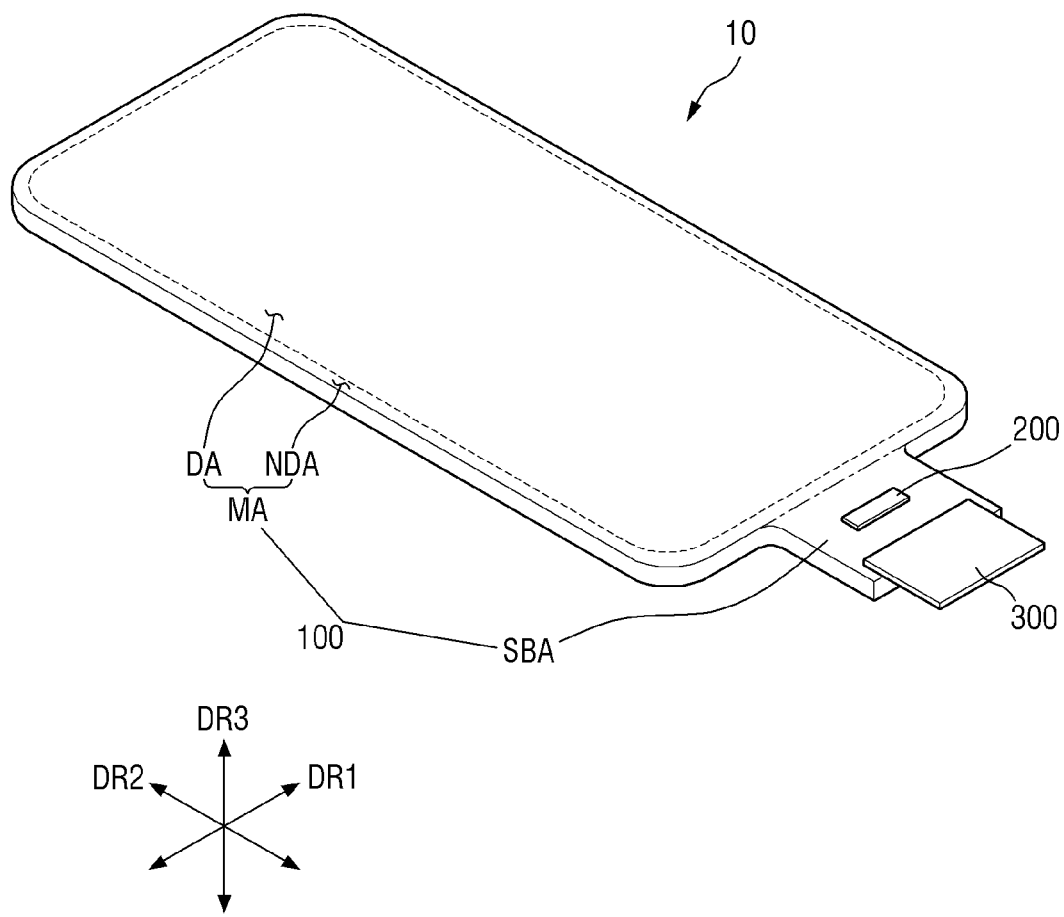
FIG. 1 is a perspective view of a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from" for the purpose of its meaning and interpretation. For example, "at least one of A and B" or "at least one selected from A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 2:
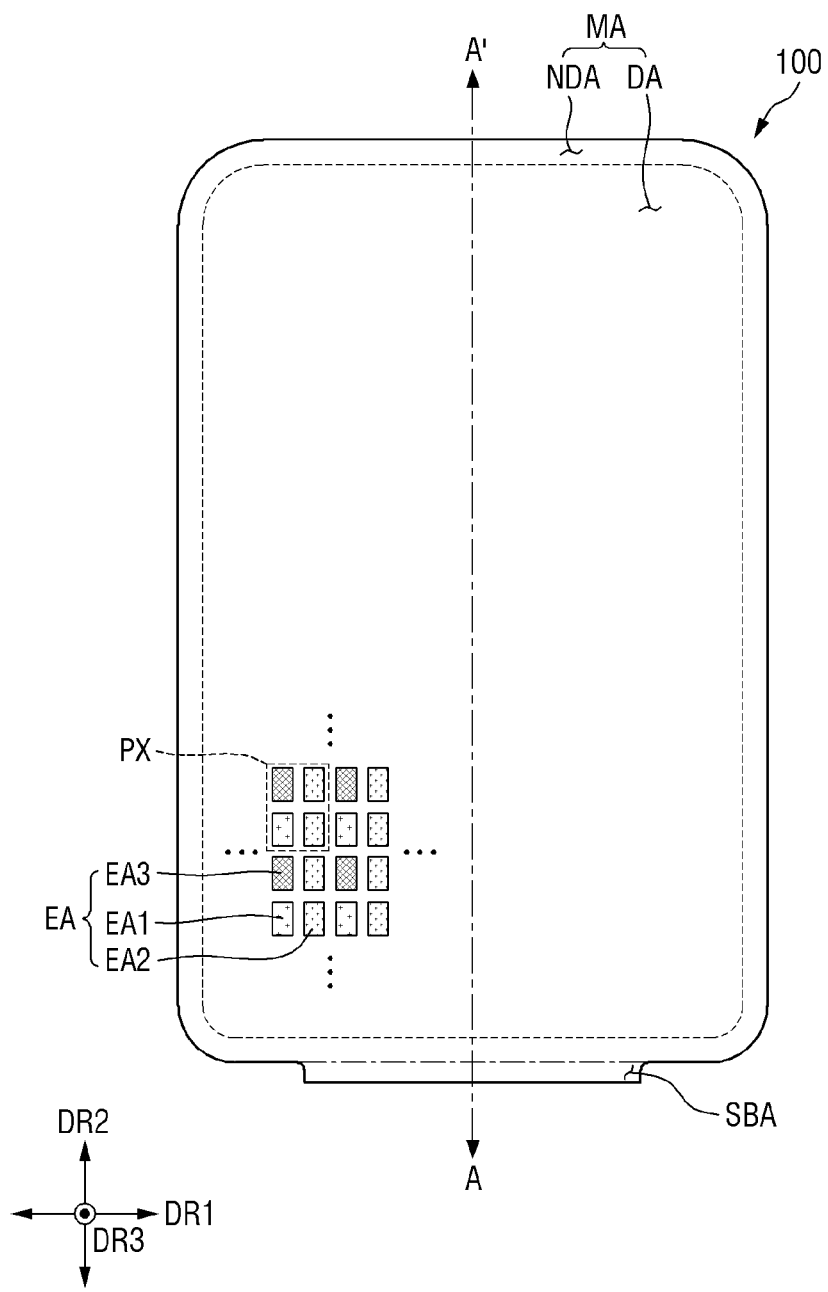
FIG. 2 is a plan view showing the display device of FIG. 1.
Figure 3:
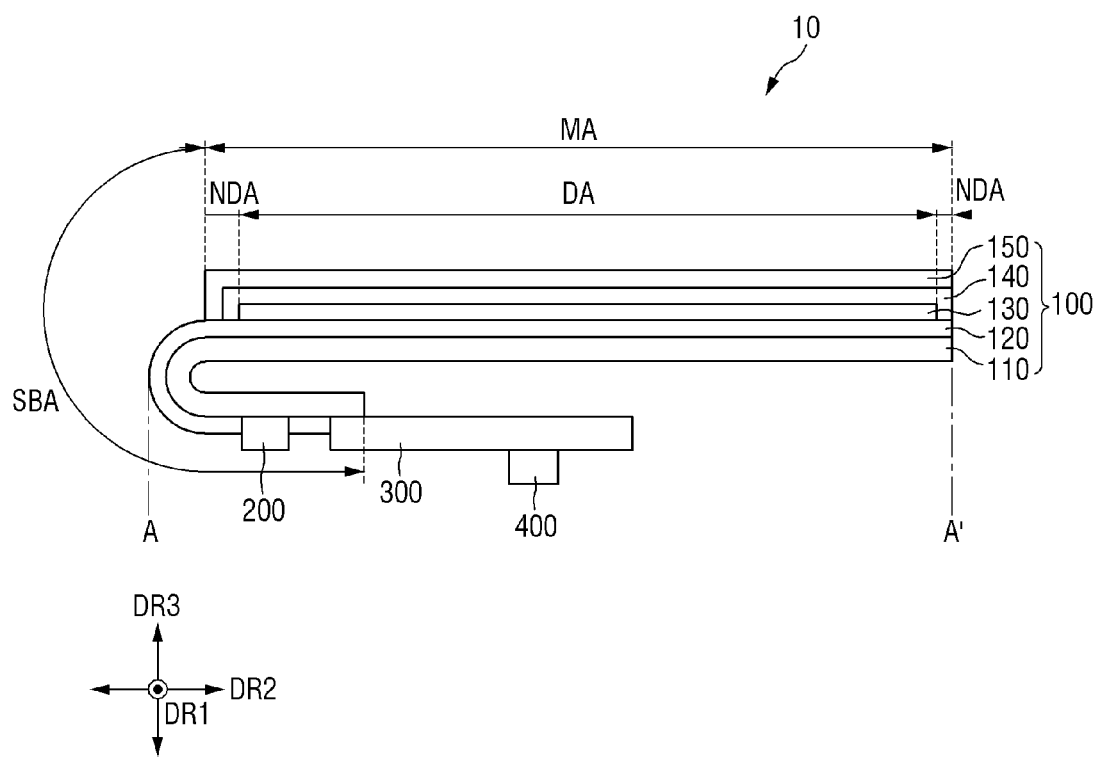
FIG. 3 is a cross-sectional view showing an example, taken along line A-A' of FIG. 2.
Figure 4:
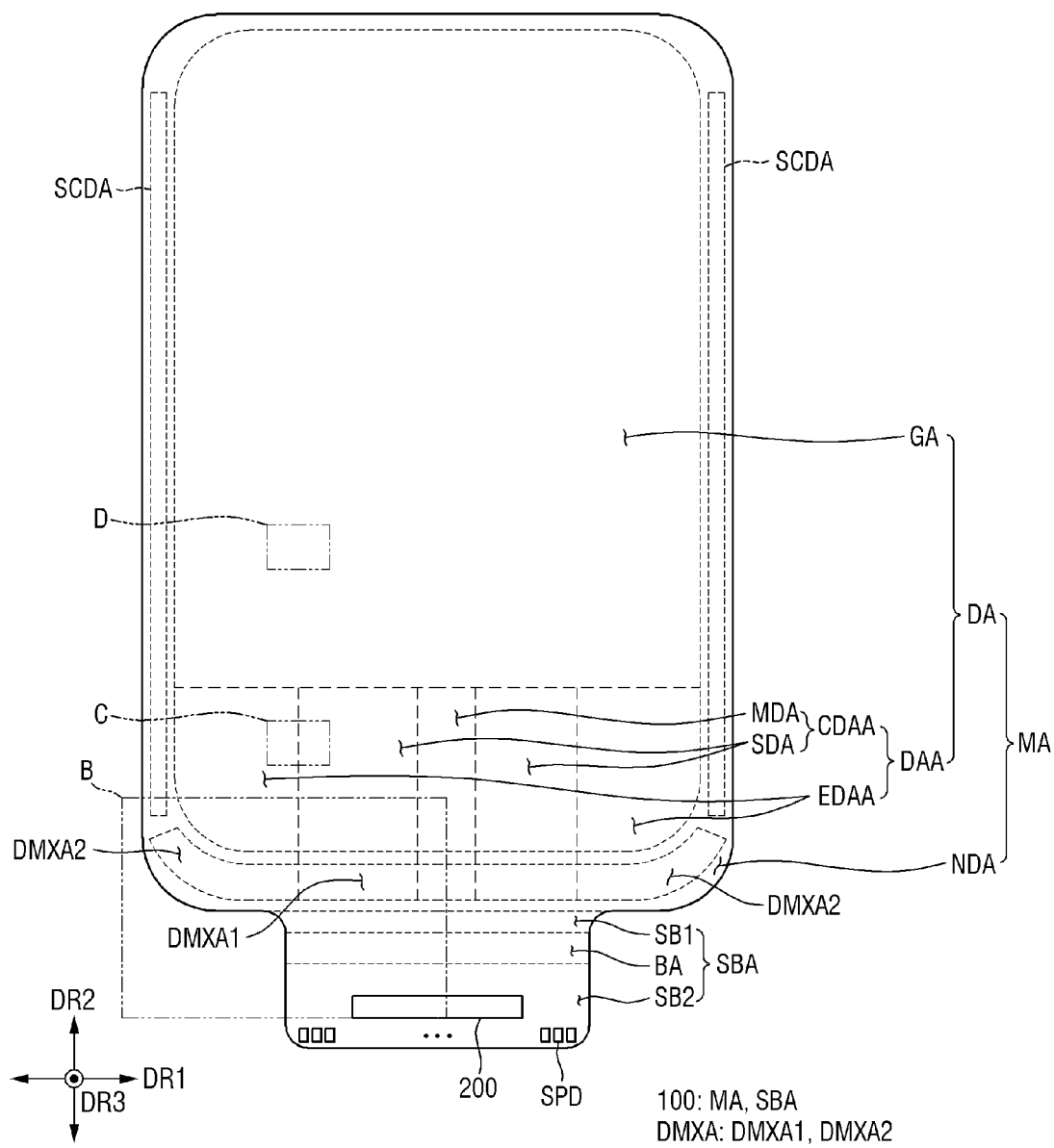
FIG. 4 is a plan view showing a main area and a subsidiary area of the display device of FIG. 1.

FIG. 1 is a perspective view of a display device according to an embodiment of the disclosure. FIG. 2 is a plan view showing the display device of FIG. 1. FIG. 3 is a cross-sectional view showing an example, taken along line A-A' of FIG. 2. FIG. 4 is a plan view showing a main area and a subsidiary area of the display device of FIG. 1.

Referring to FIG. 1, a display device 10 is for displaying moving images or still images. The display device 10 may be used as the display screen of portable electronic devices such as a mobile phone, a smart phone, a tablet personal computer (PC), a smart watch, a watch phone, a mobile communications terminal, an electronic notebook, an electronic book, a portable multimedia player (PMP), a navigation device and a ultra mobile PC (UMPC), as well as the display screen of various products such as a television, a notebook, a monitor, a billboard and Internet of Things (IoT).

The display device 10 may be a light-emitting display device such as an organic light-emitting display device using organic light-emitting diodes, an inorganic light-emitting display device including an inorganic semiconductor, and a micro light-emitting display device using micro light-emitting diodes (micro LEDs) or nano light-emitting diodes (nano LEDs). Hereinafter, for convenience of description, embodiments where the display device 10 is an organic light-emitting display device will be described. It should be understood, however, that the disclosure is not limited thereto. In embodiments, any display device including an organic insulating material, an organic light-emitting material and a metal material may be employed as the display device 10.

The display device 10 may be formed flat, but is not limited thereto. In an embodiment, for example, the display device 10 may include curved portions that are formed at left and right ends and have a constant curvature or varying curvatures. In addition, the display device 10 may be flexible to be curved, bent, folded or rolled.

The display device 10 may include a display panel 100, a display driver circuit 200 and a circuit board 300.

The display panel 100 includes a display area DA in which a plurality of emission areas EA (see FIG. 5) for displaying images is arranged.

In an embodiment, the display panel 100 may include a main area MA including the display area DA and the non-display area NDA around the display area DA, and a subsidiary area SBA protruding from one side of the main area MA in the second direction DR2.

FIGS. 1 and 4 show an embodiment in a state where the subsidiary area SBA and the main area MA are unfolded. On the other hand, FIG. 2 shows an embodiment in a state where a part of the subsidiary area SBA is bent.

Referring to FIG. 2, the display area DA may be formed in a rectangular plane having shorter sides in a first direction DR1 and longer sides in a second direction DR2 intersecting the first direction DR1. A third direction DR3 may be a direction perpendicular to the first direction DR1 and the second direction DR2, or a thickness direction of the display panel 100. Each of the corners where the short side in the first direction DR1 meets the longer side in the second direction DR2 may be rounded with a predetermined curvature or may be a right angle. The shape of the display area DA when viewed from a top plan view (or a plan view in the third direction DR3) is not limited to a quadrangular shape, but may be formed in a different polygonal shape, a circular shape, or an elliptical shape.

The display area DA may occupy most of the main area MA. The display area DA may be disposed at the center of the main area MR.

The display area DA may include a plurality of emission areas EA arranged in parallel with one another. In addition, the display area DA may further include a non-emission area NEA (see FIG. 10) that is a space between the emission areas EA.

The emission areas EA may be arranged parallel to one another in the first direction DR1 and the second direction DR2.

Each of the emission areas EA may have a diamond shape or a rectangular shape when viewed from a top plan view (or when viewed in the third direction DR3). It should be understood, however, that this is merely illustrative. The shape of the emission areas EA according to an embodiment when viewed from a top plan view is not limited to that shown in FIG. 9. The emission areas LE may have other polygonal shape than a quadrangular shape, a circular shape, or an elliptical shape.

The plurality of emission areas EA may include first emission areas EA1 for emitting light of a first color in a predetermined wavelength band; second emission areas EA2 for emitting light of a second color in a wavelength band lower than that of the first color; and third emission areas EA3 for emitting light of a third color in a wavelength band lower than that of the second color.

In an embodiment, for example, the first color may be red with a wavelength of approximately 600 nanometers (nm) to 750 nm. In such an embodiment, the second color may be green with a wavelength of approximately 480 nm to 560 nm. In such an embodiment, the third color may be blue with a wavelength of approximately 370 nm to 460 nm.

In an embodiment, as shown in FIG. 2, the first emission areas EA1 and the third emission areas EA3 may be arranged alternately in the first direction DR1 or the second direction DR2. In addition, the second emission areas EA2 may be arranged parallel to one another in the first direction DR1 or the second direction DR2.

A plurality of pixels PX, each representing the respective luminance and color, may be formed or defined by the plurality of emission areas EA. Each of the plurality of pixels PX may be a basic unit for representing various colors including white with a predetermined luminance.

Each of the plurality of pixels PX may include at least one first emission area EA1, at least one second emission area EA2, and at least one third emission area EA3 adjacent to one another.

Each of the plurality of pixels PX may represent a color and a luminance that is generated by mixing the lights emitted from at least one first emission area EA1, at least one second emission area EA2, and at least one third emission area EA3 adjacent to one another.

Although FIG. 2 shows an embodiment where the emission areas EA have a same area as each other, this is merely illustrative. In an alternative embodiment, for example, the third emission area EA3 may have the greatest area, and the second emission area EA2 may have the smallest area.

Although FIG. 2 shows an embodiment where the emission areas EA are arranged side by side in the first direction DR1 and the second direction DR2, this is merely illustrative. In an alternative embodiment, for example, the second emission areas EA2 may be adjacent to the first and third emission areas EA1 and EA3 in diagonal directions crossing the first and second directions DR1 and DR2.

Referring to FIG. 3, the display panel 100 of the display device 10 includes a substrate 110 including the main area MA and the subsidiary area SBA, and a circuit array layer 120 disposed on the substrate 110. The circuit array layer 120 includes a plurality of pixel drivers PXD (see FIGS. 12 and 13) associated with a plurality of emission areas EA, respectively, and data lines DL (see FIGS. 5, 12 and 13) for transmitting data signals to the plurality of pixel drivers PXD.

In addition, the display panel 100 of the display device 10 may further include a light-emitting array layer 130 disposed on the circuit array layer 120. The light-emitting array layer 130 includes a plurality of light-emitting elements LEL (see FIGS. 6, 7 and 10) associated with the plurality of emission areas EA, respectively.

In addition, the display panel 100 of the display device 10 may further include an encapsulation structure 140 covering the light-emitting array layer 130, and a sensor electrode layer 150 disposed on the encapsulation structure 140.

The substrate 110 may include or be made of an insulating material such as a polymer resin. In an embodiment, for example, the substrate 110 may include or be made of polyimide. The substrate 110 may be a flexible substrate that can be bent, folded, or rolled.

Alternatively, the substrate 110 may include or be made of an insulating material such as glass.

The encapsulation structure 140 is disposed on the circuit array layer 120, is disposed in the main area MA, and covers the light-emitting array layer 130. The encapsulation structure 140 may include a structure in which at least one inorganic film and at least one organic film are alternately stacked on the light-emitting array layer 130.

The sensor electrode layer 150 may be disposed on the encapsulation structure 140 and in the main area MA. The sensor electrode layer 150 may include touch electrodes for sensing a touch of a person or an object.

The display device 10 may further include a cover window (not shown) disposed on the sensor electrode layer 150. The cover window may be attached on the sensor electrode layer 150 by a transparent adhesive member such as an optically clear adhesive (OCA) film and an optically clear resin (OCR). The cover window may be an inorganic material such as glass, or an organic material such as plastic and polymer material. In such an embodiment, the cover window may protect the sensor electrode layer 150, the encapsulation structure 140, the light-emitting array layer 130 and the circuit array layer 120 from electrical and physical impact on the display surface.

In addition, the display device 10 may further include an anti-reflection member (not shown) disposed between the sensor electrode layer 150 and the cover window. The anti-reflection member may be a polarizing film or a color filter. In such an embodiment, the anti-reflection member may prevent the visibility of the images on the display device 10 from being deteriorated by blocking the external light reflected off the sensor electrode layer 150, the encapsulation structure 140, the light-emitting array layer 130 and the circuit array layer 120 and the interfaces thereof.

The display device 10 may further include a touch driver circuit 400 for driving the sensor electrode layer 150.

The touch driver circuit 400 may be implemented as an integrated circuit (IC). The touch driver circuit 400 may be mounted on the circuit board 300 bonded to the signal pads SPD and electrically connected to the sensor electrode layer 150.

Alternatively, like the display driver circuit 200, the touch driver circuit 400 may be mounted on a second subsidiary area SB2 of the substrate 110.

The touch driver circuit 400 may apply a touch driving signal to a plurality of driving electrodes disposed in the sensor electrode layer 150, may receive a touch sensing signal of each of a plurality of touch nodes through a plurality of sensing electrodes, and may sense a change in the mutual capacitance based on the touch sensing signal.

That is to say, the touch driver circuit 400 may determine whether there is a user's touch or near proximity, based on the touch sensing signal of each of the plurality of touch nodes. A user's touch refers to that an object such as the user's finger or a pen is brought into contact with the front surface of the display device 10. A user's near proximity refers to that an object such as the user's finger and a pen is hovering over the front of the display device 10.

Referring to FIG. 4, the subsidiary area SBA includes a bending area BA that is transformed to be bent, and a first subsidiary area SB1 and a second subsidiary area SB2 that are adjacent to opposing sides of the bending area BA.

The first subsidiary area SB1 is disposed between the main area MA and the bending area BA. One side of the first subsidiary area SB1 may be adjacent to the non-display area NDA of the main area MA, and the opposite side (i.e., the side opposite to the one side) of the first subsidiary area SB1 may be adjacent to the bending area BA.

The second subsidiary area SB2 is spaced apart from the main area MA with the bending area BA therebetween and is disposed on the lower surface of the substrate 110 by the bending area BA that is changed into a bent shape. That is to say, the second subsidiary area SB2 may overlap with the main region MA in a thickness direction of the substrate SUB or the third direction DR3 in a state where the bending area BA is changed into a bent shape.

One side of the second subsidiary area SB2 may be adjacent to the bending area BA. The opposite side of the second subsidiary area SB2 may be adjacent to a part of an edge of the substrate 110.

Signal pads SPD and the display driver circuit 200 may be disposed in the second subsidiary area SB2.

The display driver circuit 200 may generate signals and voltages for driving the pixel drivers PD of the display area DPA.

The display driver circuit 200 may be implemented as an IC and may be mounted on the subsidiary area SBA of the substrate 110 by a chip on glass (COG) technique, a chip on plastic (COP) technique, or an ultrasonic bonding. It is, however, to be understood that the disclosure is not limited thereto. In an alternative embodiment, for example, the display driver circuit 200 may be attached on the circuit board 300 by the chip-on-film (COF) technique.

The circuit board 300 may be attached on the signal pads SDP of the second subsidiary area SB2 using a low-resistance, high-reliability material such as an anisotropic conductive film and SAP and may be electrically connected to it.

The pixel drivers PD of the display area DPA and the display driver circuit 200 may receive digital video data, timing signals, and driving voltages through the circuit board 300.

The circuit board 300 may be a flexible printed circuit board, a printed circuit board, or a flexible film such as a chip on film.

The non-display area NDA includes a demux area DMXA located between the display area DA and the subsidiary area SBA.

In addition, the non-display area NDA may further include a scan driver circuit area SCDA disposed adjacent to at least one side of the display area DA in the first direction DR1.

The circuit array layer 120 may include a scan driver circuit (not shown) in the scan driver circuit area SCDA. The scan driver circuit may supply scan signals to scan lines disposed in the display area DA and extend in the first direction DR1.

In an embodiment, for example, the display driver circuit 200 or the circuit board 300 may supply a scan control signal to the scan driver circuit based on digital video data and timing signals.

In addition, the circuit board 300 may supply a constant voltage for generating the scan signals to the scan driver circuit.

Although FIG. 4 shows an embodiment where the scan driver circuit areas SCDA are parts of the non-display area NDA that are adjacent to both sides of the display area DA in the first direction DR1, this is merely illustrative. Although not shown in the drawings, the scan driver circuit area SCDA may be a part of the non-display area NDA that is any one side of the display area DA in the first direction DR1, and may be divided into subsidiary areas overlapping with parts of the display area DA.

The demux area DMXA is a part of the non-display area NDA that is adjacent to the subsidiary area SBA. Demux circuits DMC (see FIG. 5) connected between the data lines DL of the display area DA and the display driver circuit 200 are disposed in the demux area DMXA.

Each of the demux circuits DMC outputs two or more data signals based on one data driving signal.

In an embodiment, one demux circuit DMC among the demux circuits DMC may receive one data driving signal from the display driver circuit 200 at an input terminal thereof, may generate two or more data signals by time-divisionally demultiplexing the one data driving signal, and may output the two or more data signals for different periods at two or more output terminals thereof respectively connected to two or more data lines DL.

The demux area DMXA may include a first demux area DMXA1 that is adjacent to the subsidiary area SBA at the center thereof, and second demux areas DMXA2 adjacent to opposing sides of the first demux area DMXA1 in the first direction DR1, respectively.

The display area DA may include a demux adjacent area DAA adjacent to the demux area DMXA, and a general area GA that is the remaining area other than (or except for) the demux adjacent area DAA. Demux detour lines DETL (see FIG. 5) are disposed in the demux adjacent area DAA.

The demux adjacent area DAA may include a center adjacent area CDAA adjacent to the first demux area DMXA1 in the second direction DR2, and edge adjacent areas EDAA adjacent to the second demux areas DMXA2 in the second direction DR2, respectively.

The center adjacent area CDAA is a central portion of the demux adjacent area DAA.

The edge adjacent areas EDAA are parts of the demux adjacent area DAA between the center adjacent area CDAA and the non-display area NDA.

In such an embodiment, the center adjacent area CDAA may be adjacent to the edge adjacent areas EDAA on opposing sides in the first direction DR1, respectively.

The center adjacent area CDAA may include a middle area MDA at the center in the first direction DR1, and side areas SDA between the middle area MDA and the edge adjacent areas EDAA.

In such an embodiment, the middle area MDA may be adjacent to the side areas SDA on both sides in the first direction DR1.

Figure 5:
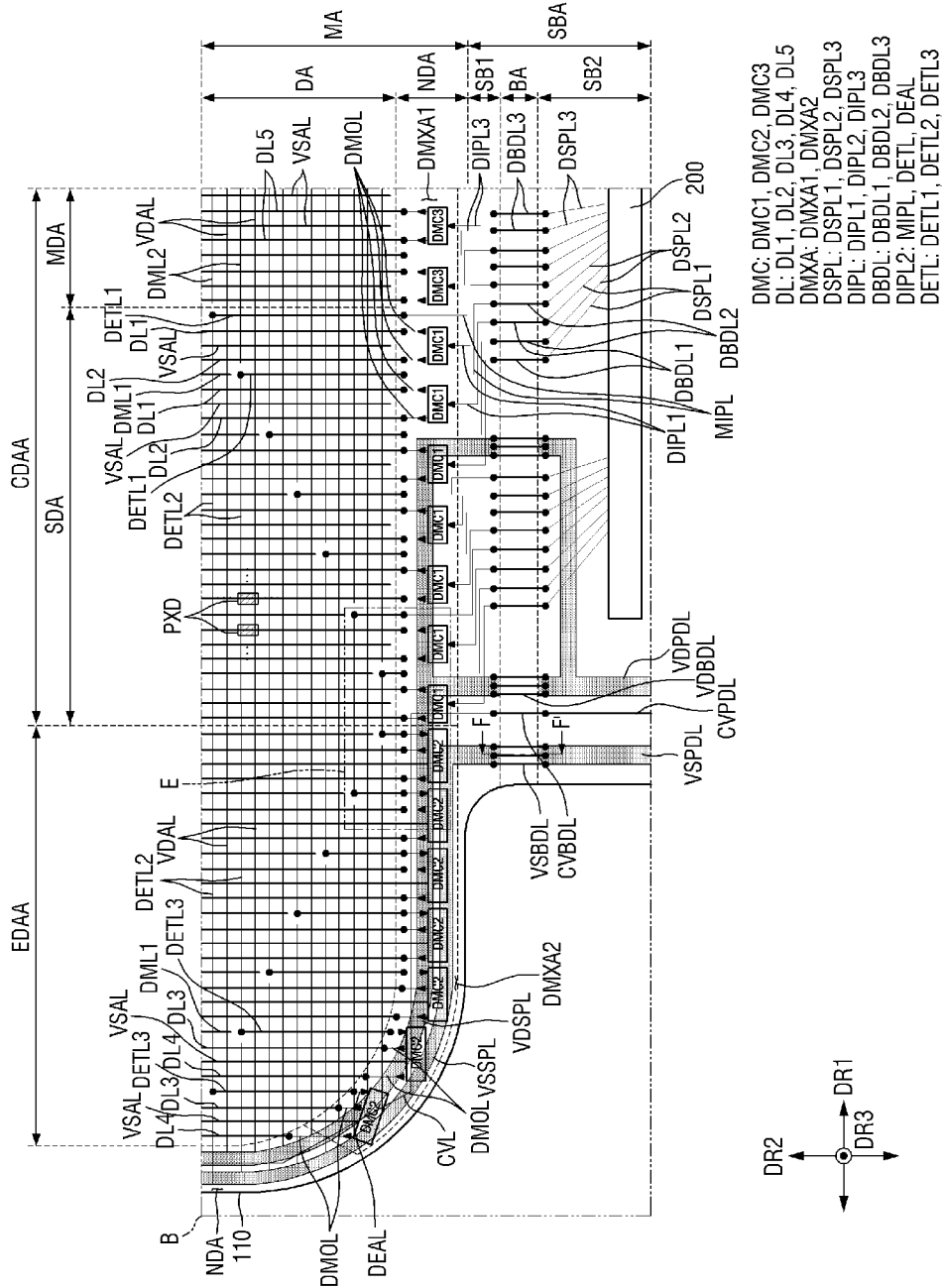
FIG. 5 is a plan view showing portion B of FIG. 4 according to an embodiment.

FIG. 5 is a plan view showing portion B of FIG. 4 according to an embodiment.

Referring to FIG. 5, the display device 10 according to an embodiment of the disclosure includes: a substrate 110 including a main area MA including a display area DA and a non-display area NDA, and a subsidiary area SBA protruding from one side of the main area MA; a circuit array layer 120 disposed on the substrate 110 and including a plurality of pixel drivers PXD respectively associated with a plurality of emission areas EA, data lines DL for transferring data signals to the plurality of pixel drivers PXD, and demux circuits DMC disposed in the demux area DMXA of the non-display area NDA; and a display driver circuit 200 disposed in the subsidiary area SBA of the substrate 110 for supplying data driving signals associated with the data lines DL.

The demux circuits DMC are electrically connected between the display driver circuit 200 and the data lines DL, and output data signals of the data lines DL based on data driving signals received from the display driver circuit 200.

In an embodiment, one of the demux circuits DMC is connected to two or more data lines DL and outputs two or more data signals based on one data driving signal.

The demux circuits DMC include first demux circuits DMC1 disposed in the first demux area DMXA1 and second demux circuits DMC2 disposed in the second demux areas DMXA2.

The circuit array layer 120 further includes first data input lines DIPL1 connected to the input terminals of the first demux circuits DMC1, and second data input lines DIPL2 connected to the input terminals of the second demux circuits DMC2.

The first data input lines DIPL1 extend from the subsidiary area SBA to the first demux area DMXA1.

The second data input lines DIPL2 include a main input line MIPL extending from the subsidiary area SBA to the first demux area DMXA1; a demux detour line DETL disposed in the display area DA and connected to the main input line MIPL; and a detour additional line DEAL disposed in the second demux areas DMXA2 and connected between the demux detour line DETL and the input terminal of the second demux circuit DMC2.

In such an embodiment, as the second data input lines DIPL2 detour to the first demux area DMXA1 and the display area DA by the main input line MIPL and the demux detour line DETL, and thus the second data input lines DIPL2 are not extending from the subsidiary area SBA to the second demux area DMXA2. Accordingly, since the second data input lines DIPL2 are not disposed in the second demux areas DMXA2, the width of the second demux areas DMXA2 bent along the corners of the substrate can be reduced.

The circuit array layer 120 may further include a first data supply line DSPL1 and a second data supply line DSPL2 disposed in the second subsidiary area SB2 and connected to output terminals of the display driver circuit 200, respectively, a first data bending line DBDL1 connected to the first data supply line DSPL1 and disposed in the bending area BA, and a second data bending line DBDL2 connected to the second data supply line DSPL2 and disposed in the bending area BA. The first data input line DIPL1 may connect between the first data bending line DBDL1 and the input terminal of the first demux circuit DMC1. The second data input line DIPL2 may be connected between the second data input line DBDL2 and the input terminal of the second demux circuit DMC2.

The demux detour line DETL of the second data input line DIPL2 may be disposed in the demux adjacent area DAA of the display area DA.

In such an embodiment, the demux detour lines DETL may include a first detour line DETL1 disposed in the center adjacent area CDAA, connected to the main input line MIPL and extended in the second direction DR2; a second detour line DETL2 connected to the first detour line DETL1 and extending in the first direction DR1; and a third detour line DETL3 disposed in the edge adjacent area EDAA, extended in the second direction DR2 toward the second demux areas DMXA2 and connected between the second detour line DETL2 and the detour additional line DEAL.

As such, the second data input line DIPL2 between the second demux circuit DMC2 and the second data bending line DBDL2 is not extending directly from the first subsidiary area SB1 to the second demux areas DMXA2 but detours to the first demux area DMXA1 and the display area DA from the first subsidiary area SB1 to extend to the second demux areas DMXA2.

In an embodiment, the first data input line DIPL1 between the first demux circuit DMC1 and the first data bending line DBDL1 extend from the first subsidiary area SB1 to the first demux area DMXA1.

The data lines DL may extend in the second direction DR2.

The data lines DL may include a first data line DL1 and a second data line DL2 connected to the first demux circuit DMC1 and disposed in the center adjacent area CDAA, and a third data line DL3 and a fourth data line DL4 connected to the second demux circuit DMC2 and disposed in the edge adjacent area EDAA.

The center adjacent area CDAA of the demux adjacent area DAA of the display area DA may include a middle area MDA at the center in the first direction DR1, and side areas SDA between the middle area MDA and the edge adjacent areas EDAA. In such an embodiment, the middle area MDA may be adjacent to the side areas SDA on both sides in the first direction DR1.

The first detour line DETL1 is not disposed in the middle area MDA.

In an embodiment, the main input line MIPL of the second data input line DIPL2 is disposed in a part of the first demux area DMXA that is adjacent to the side area SDA, and the main input line MIPL of the second data input line DIPL2 is not disposed in another part that is adjacent to the middle area MDA.

In such an embodiment, the first demux circuit DMC1 may be disposed only in a part of the first demux area DMXA1 that is adjacent to the side area SDA, and the demux circuits DMC may further include a third demux circuit DMC3 disposed in another part of the first demux area DMXA1 that is adjacent to the middle area DMA.

The data lines DL may further include a fifth data line DL5 disposed in the middle area MDA and connected to the third demux circuit DMC3.

Unlike the side areas SDA, the first detour line DETL1 is not disposed in the middle area MDA, and two or more fifth data lines disposed in the middle area MDA and connected to the third demux circuit DMC3 may be disposed adjacent to the second voltage auxiliary line VSAL.

The circuit array layer 120 may further include a first voltage supply line VDSPL and a second voltage supply line VSSPL which are disposed in the non-display area NDA and respectively transmit a first voltage and a second voltage for driving the light-emitting elements LEL on the light-emitting array layer 130.

In addition, the circuit array layer 120 may further include a second voltage auxiliary line VSAL disposed in the display area DA, extending in the second direction DR2 and electrically connected to the second voltage supply line VSSPL.

The first voltage supply line VDSPL may extend from the first subsidiary area SB1 to the non-display area NDA and may surround the display area DA.

The second voltage supply line VSSPL may extend from the first subsidiary area SB1 to the non-display area NDA and may surround the first voltage supply line VDSPL.

The circuit array layer 120 may further include data output lines DMOL disposed in the demux area DMXA and connected between the output terminals of the demux circuits DMC and the data lines DL.

The output terminals of the first demux circuits DMC1 disposed in the first demux area DMXA1 may be connected to the first and second data lines DL1 and DL2 disposed in the center adjacent area CDAA and adjacent to each other.

Since the first detour line DETL1 of the second data input line DIPL2 is disposed in the center adjacent area CDAA and extending in the second direction DR2, the first detour line DETL1 may be disposed adjacent to one of the first data line DL1 and the second data line DL2.

In an embodiment, one of the first data line DL1 and the second data line DL2 connected to the first demux circuit DMC1 (e.g., the first data line DL1) may be disposed adjacent to the first detour line DETL1.

In such an embodiment, the other one of the first data line DL1 and the second data line DL2 connected to the first demux circuit DMC1 (i.e., the second data line DL2) may be disposed adjacent to the second voltage auxiliary line VSAL.

The output terminals of the second demux circuits DMC2 disposed in the second demux areas DMXA2 may be connected to the third and fourth data lines DL3 and DL4 disposed in the edge adjacent area EDAA and adjacent to each other.

Since the third detour line DETL3 of the second data input line DIPL2 is disposed in the edge adjacent area EDAA and extending in the second direction DR2, the third detour line DETL3 may be disposed adjacent to one of the third data line DL3 and the fourth data line DL4.

In an embodiment, one of the third data line DL3 and the fourth data line DL4 connected to the second demux circuit DMC2 (e.g., the third data line DL3) may be disposed adjacent to the third detour line DETL3.

In such an embodiment, the other one of the third data line DL3 and the fourth data line DL4 connected to the second demux circuit DMC3 (i.e., the fourth data line DL4) may be disposed adjacent to the second voltage auxiliary line VSAL.

According to an embodiment, the circuit array layer 120 may further include a first voltage auxiliary line VDAL disposed in the display area DA, extending in the first direction DR1 and electrically connected to the first voltage supply line VS SPL electrically connected to the first voltage supply line VDSPL.

In addition, the circuit array layer 120 may further include a second voltage sub-line VSSBL (see FIG. 17) disposed in the general area DA of the display area DA, extending in the first direction DR1 and electrically connected to the second voltage supply line VSSPL.

The second detour line DETL2 is disposed in the demux adjacent area DAA and extends in the first direction DR1.

Accordingly, the first voltage auxiliary line VDAL may be disposed adjacent to the second detour line DETL2 in the demux adjacent area DAA and adjacent to the second voltage sub-line VSSBL in the general area GA.

In other words, in the demux adjacent area DAA, the first voltage auxiliary line VDAL and the second detour line DETL2 may be arranged alternately in the second direction DR2.

In addition, in the general area GA, the first voltage auxiliary line VDAL and the second voltage sub-line VSSBL may be arranged alternately in the second direction DR2.

The circuit array layer 120 may further include first dummy lines DML1 respectively aligned with the first detour line DETL1 and the third detour line DETL3, respectively spaced apart from one side of the first detour line DETL1 in the second direction DR2 and one side of the third detour line DETL3 in the second direction DR2 and extended in the second direction DR2, and second dummy lines DML2 disposed aligned with the second detour line DETL2, respectively spaced apart from both sides of the second detour line DETL2 in the first direction DR1 and extended in the first direction DR1.

In such an embodiment, the first dummy lines DML1 and the second dummy lines DML2 are provided in addition to the second voltage auxiliary line VSAL, the first voltage auxiliary line VDAL and the second voltage sub-line VSSBL, the demux detour lines DETL (DETL1, DETL2 and DETL3) disposed only in a part of the display area DA may be effectively prevented from being visually recognized.

A part of each of the first voltage supply line VDSPL and the second voltage supply line VS SPL may overlap with the demux circuits DMC.

That is to say, in the demux area DMXA, a part of each of the first voltage supply line VDSPL and the second voltage supply line VSSPL is further disposed in addition to the demux circuits DMC.

In this manner, it is possible to prevent the width of the non-display area NDA from increasing as much as the width of the demux area DMXA. As described above, by forming the demux area DMXA, the width of the non-display area NDA is not greatly increased, so that it may be advantageous in reducing the width of the non-display area NDA.

According to an embodiment, the circuit array layer 120 may further include a first voltage bending line VDBDL connected to the first voltage supply line VDSPL and disposed in the bending area BA, a second voltage bending line VSBDL connected to the second voltage supply line VS SPL and disposed in the bending area BA, a first voltage pad line VDPDL connected to the first voltage bending line VDBDL and disposed in the second subsidiary area SB2; and a second voltage pad line VSPDL connected to the second voltage bending line VSBDL and disposed in the second subsidiary area SB2.

Although not shown in the drawings, the first voltage pad line VDPDL and the second voltage pad line VSPDL may be connected to different signal pads SPD.

As described above, the display device 10 according to an embodiment includes the demux circuits DMC connected between the display driver circuit 200 and the data lines DL. Accordingly, the output terminals of the display driver circuit 200 are not directly connected to the data lines DL but are connected to the demux circuits DMC which are fewer than the data lines DL.

That is to say, the number of first and second data supply lines DSPL1 and DSPL2 connected to the display driver circuit 200, the number of first and second data bending lines DBDL1 and DBDL2 connected to the first and second data supply lines DSPL1 and DSPL2, the number of first and second data input lines DIPL1 and DIPL2 connected to the first and second data bending lines DBDL1 and DBDL2, and the number of demux circuits DMC may be in inverse proportion to the number of demux transistors included in each of the demux circuits DMC and may be smaller than the number of data lines DL.

Therefore, as the numbers of the first and second data supply lines DSPL1 and DSPL2 disposed in the second subsidiary area SB2 is reduced, the distance between the first and second data supply lines DSPL1 and DSPL2 can be increased or the width of the second subsidiary area SB2 can be reduced.

As the numbers of the first and second data bending lines DBDL1 and DBDL2 disposed in the bending area BA are reduced, the distance between the first and second data bending lines DBDL1 and DBDL2 can be increased or the width of the bending area BA can be reduced.

That is to say, the distance between the lines disposed in the subsidiary area SBA can be increased without reducing the number of data lines DL which may affect the resolution.

In addition, the second data input lines DIPL2 connected to the second demux circuits DMC2 disposed in the second demux area DMXA2 are not extended from the first subsidiary area SB1 to the second demux areas DMXA2 but detour to the first demux area DMXA1 and the display area DA from the first subsidiary area SB1 to be extended to the second demux areas DMXA2.

In this manner, a smaller area of the second demux areas DMXA2 where the second demux circuits DMC2 are disposed is allocated for the arrangement of the second data input lines DIPL2. That is, since the widths of the second demux areas DMXA2 corresponding to the corners of the main area MA can be reduced, it may be advantageous to reduce the width of the non-display area NDA.

Figure 6:
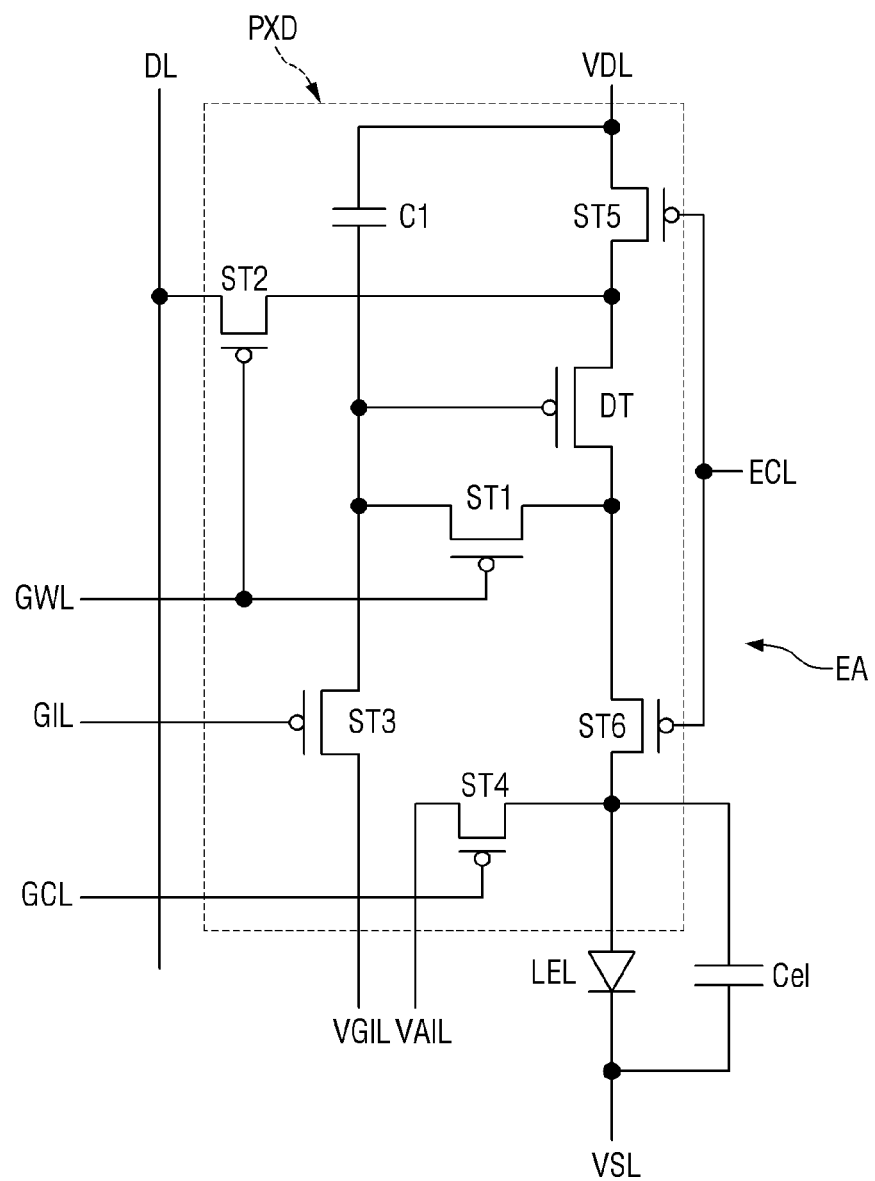
FIG. 6 is an equivalent circuit diagram showing an example of the pixel driver of FIG. 5.
Figure 7:
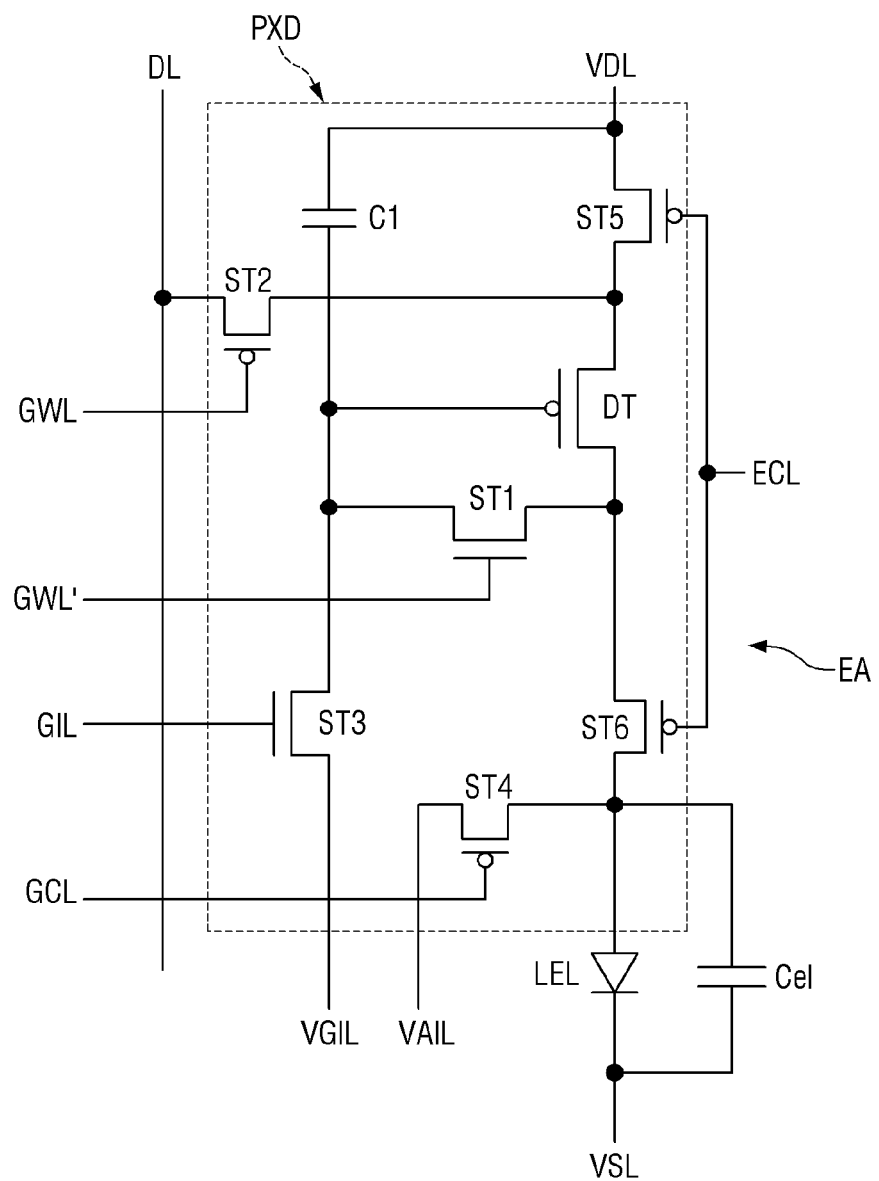
FIG. 7 is an equivalent circuit diagram showing another example of the pixel driver of FIG. 5.

FIG. 6 is an equivalent circuit diagram showing an example of the pixel driver of FIG. 5. FIG. 7 is an equivalent circuit diagram showing another example of the pixel driver of FIG. 5.

The circuit array layer 120 includes a plurality of pixel drivers PXD associated with a plurality of emission areas EA, respectively. The pixel drivers PXD respectively supply driving currents to a plurality of light-emitting elements LEL disposed in the light-emitting array layer 130.

Each of the plurality of pixel drivers PXD may include a driving transistor DT, at least one switch element, and at least one capacitor.

Referring to FIG. 6, in an embodiment, one of the plurality of pixel drivers PXD included in the circuit array layer 120 may include switch elements including a driving transistor DT, a first transistor ST1 (switch transistor), a second transistor ST2, a third transistor ST3, a fourth transistor ST4, a fifth transistor ST5 and a sixth transistor ST6, and a capacitor C1.

In such an embodiment, the scan lines of the circuit array layer 120 connected to the scan driver circuit of the scan driver circuit area SCDA may include a write scan line GWL connected to a gate electrode of each of the first transistor ST1 and the second transistor ST2; an initialization scan line GIL connected to a gate electrode of the third transistor ST3; a control scan line GCL connected to a gate electrode of the fourth transistor ST4; and an emission control line ECL connected to a gate electrode of each of the fifth transistor ST5 and the sixth transistor ST6.

The driving transistor DT is connected in series with the light-emitting element LEL between a first voltage line VDL and a second voltage line VSL.

A first electrode of the driving transistor DT may be connected to the first voltage line VDL through the fifth transistor ST5.

In addition, the first electrode of the driving transistor DT may be connected to the data line DL through the second transistor ST2.

The second electrode of the driving transistor DT may be connected to the light-emitting element LEL through the sixth transistor ST6.

The capacitor C1 is connected between the first voltage line VDL and the gate electrode of the driving transistor DT. That is to say, the gate electrode of the driving transistor DT may be connected to the first voltage line VDL through the capacitor C1.

Accordingly, when the data signal of the data line DL is applied to the first electrode of the driving transistor DT, the driving transistor DT generates a drain-source current corresponding to the data signal. The drain-source current of the driving transistor DT is supplied as a driving current of the light-emitting element LEL.

The light-emitting element LEL emits light having a luminance corresponding to the driving current of the driving transistor DT.

The light-emitting element LEL may include an anode electrode AND (see FIG. 10) and a cathode electrode CTD (see FIG. 10) facing each other, and an emissive layer EML (see FIG. 10) between the anode electrode AND and the cathode electrode CTD.

In an embodiment, for example, the light-emitting element LEL may be an organic light-emitting diode having an emissive layer including or made of an organic light emitting material. Alternatively, the light-emitting element LEL may be an inorganic light-emitting element including an emissive layer including or made of an inorganic semiconductor. Alternatively, the light-emitting element LEL may be a quantum-dot light-emitting element having a quantum-dot emissive layer. Alternatively, the light-emitting element LEL may be a micro light-emitting diode.

In FIG. 6, a capacitor Cel connected in parallel with the light-emitting element LEL represents a parasitic capacitance between the anode electrode and the cathode electrode.

The first transistor ST1 is connected between the gate electrode of the driving transistor DT and the second electrode of the driving transistor DT.

The second transistor ST2 is connected between the first electrode of the driving transistor DT and the data line DL.

The gate electrode of each of the first transistor ST1 and the second transistor ST2 is connected to the write scan line GWL.

When a write scan signal is supplied through the write scan line GWL, the first transistor ST1 and the second transistor ST2 are turned on, and the gate electrode and the second electrode of the driving transistor DT are at the same potential through the turned-on first transistor ST1. In addition, the data signal of the data line DL is supplied to the first electrode of the driving transistor DT through the turned-on second transistor ST2.

When the voltage difference between the first electrode and the gate electrode of the driving transistor DT becomes greater than the threshold voltage, the driving transistor DT is turned on to generate a drain-source current between the first electrode and the second electrode of the driving transistor DT.

The third transistor ST3 is connected between the gate electrode of the driving transistor DT and a gate initialization voltage line VGIL. The gate electrode of the third transistor ST3 is connected to the initialization scan line GIL.

When the initialization scan signal is supplied through the initialization scan line GIL, the third transistor ST3 is turned on. At this time, the gate electrode of the driving transistor DT is connected to the gate initialization voltage line VGIL through the turned-on third transistor ST3, so that the potential of the gate electrode of the driving transistor DT is initialized to a first initialization voltage of the gate initialization voltage line VGIL.

The fourth transistor ST4 is connected between the anode electrode of the light-emitting element LEL and an anode initialization voltage line VAIL. The gate electrode of the fourth transistor ST4 is connected to the control scan line GCL.

When a control scan signal is supplied through the control scan line GCL, the fourth transistor ST4 is turned on. At this time, the anode electrode of the light-emitting element LEL is connected to the anode initialization voltage line VAIL through the turned-on fourth transistor ST4, so that the potential of the anode electrode of the light-emitting element LEL is initialized to a second initialization voltage of the anode initialization voltage line VAIL.

The fifth transistor ST5 is connected between the first electrode of the driving transistor DT and the first voltage line VDL.

The sixth transistor ST6 is connected between the second electrode of the driving transistor DT and the anode electrode of the light-emitting element LEL.

The gate electrode of each of the fifth transistor ST5 and the sixth transistor ST6 is connected to the emission control line ECL.

When an emission control signal is supplied through the emission control line ECL, the driving transistor DT and the light-emitting element LEL are connected in series between the first voltage line VDL and the second voltage line VSL, so that the light-emitting element LEL emits light based on a driving current by the driving transistor DT.

In an embodiment, as shown in FIG. 6, the driving transistor DT and the one or more switch elements ST1 to ST1 included in the pixel driver PXD may all be implemented as p-type transistors, e.g., p-type metal-oxide-semiconductor field-effect transistors (MOSFETs).

In such an embodiment, all of the scan lines GWL, GIL, GCL and ECL may supply low-level turn-on signals.

Alternatively, unlike that shown in FIG. 6, some of the driving transistor DT and the switch elements ST1 to ST6 included in the pixel driver PXD may be implemented as p-type MOSFETs, and the others may be implemented as n-type transistors, e.g., n-type MOSFETs. In such an embodiment, the switching elements implemented as the p-type MOSFETs and the switching elements implemented as the n-type MOSFETs may include active layers of different semiconductor materials from each other. Therefore, the width of the pixel driver PXD can be reduced due to a stacked structure of the active layers, thereby improving the resolution.

For example, according to an alternative embodiment as shown in FIG. 7, the pixel driver PXD includes a driving transistor DT and one or more switch elements ST1 to ST6. In such an embodiment, the driving transistor DT, the second transistor ST2, the fourth transistor ST4, the fifth transistor ST5 and the sixth transistor ST6 may be p-type MOSFETs, each having an active layer including or made of a polysilicon semiconductor material. The first transistor ST1 and the third transistor ST3 may be n-type MOSFETs each having an active layer of an oxide semiconductor material.

In such an embodiment, unlike the second transistor ST2, the first transistor ST1 may be turned on by a high-level turn-on signal, and thus the gate electrode of the first transistor ST1 may not be connected to the write scan line GWL but may be connected to a separate write scan line GWL'.

Alternatively, although not shown in the drawings, according to another alternative embodiment, the fourth transistor ST4 in addition to the first transistor ST1 and the third transistor ST3 among the switch elements ST1 to ST6 may also be n-type MOSFETs. In such an embodiment, the control scan line GCL may transmit a high-level turn-on signal.

Figure 8:
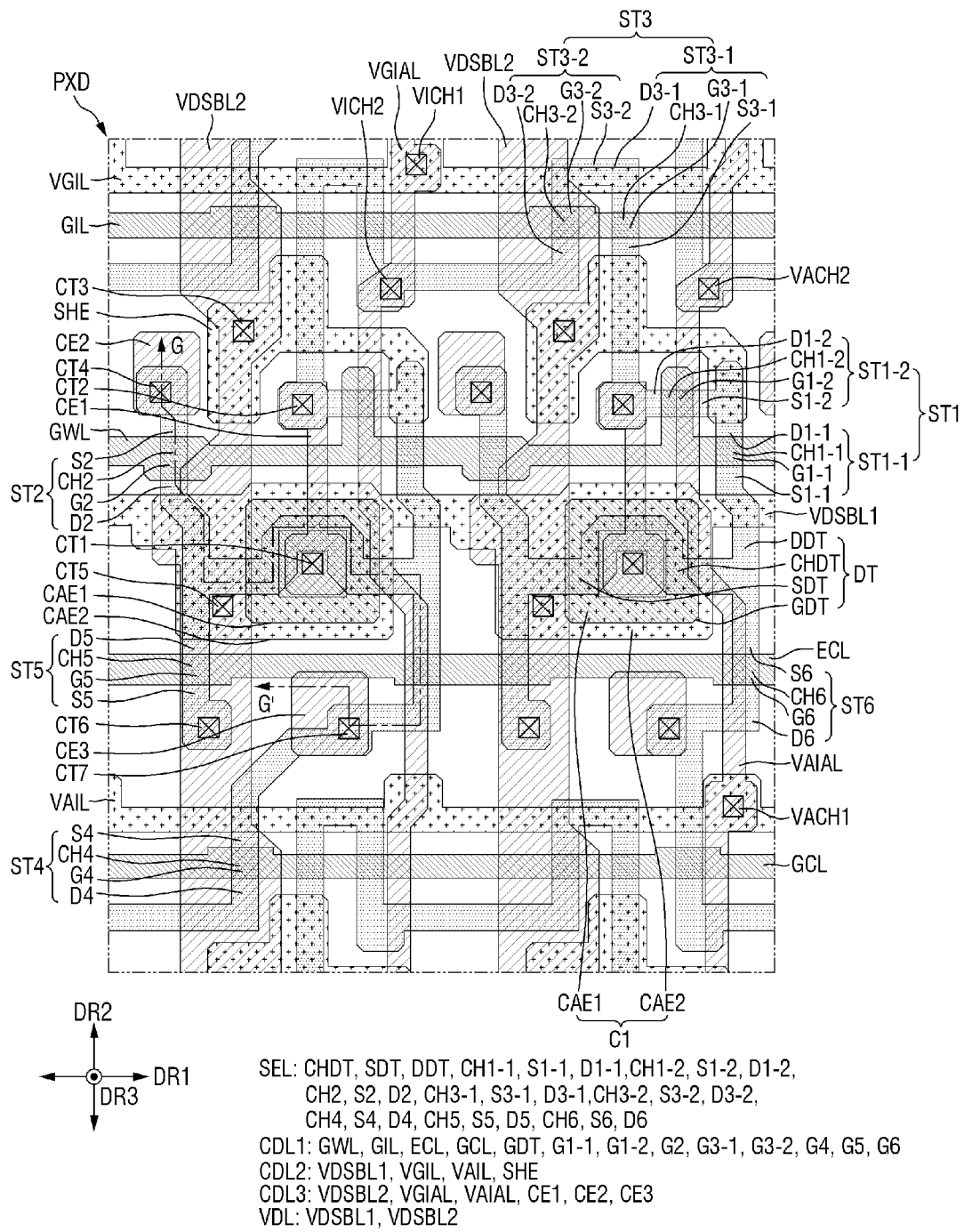
FIG. 8 is a plan view showing an example of a semiconductor layer, a first conductive layer, a second conductive layer and a third conductive layer of two adjacent pixel drivers of FIG. 5.
Figure 9:
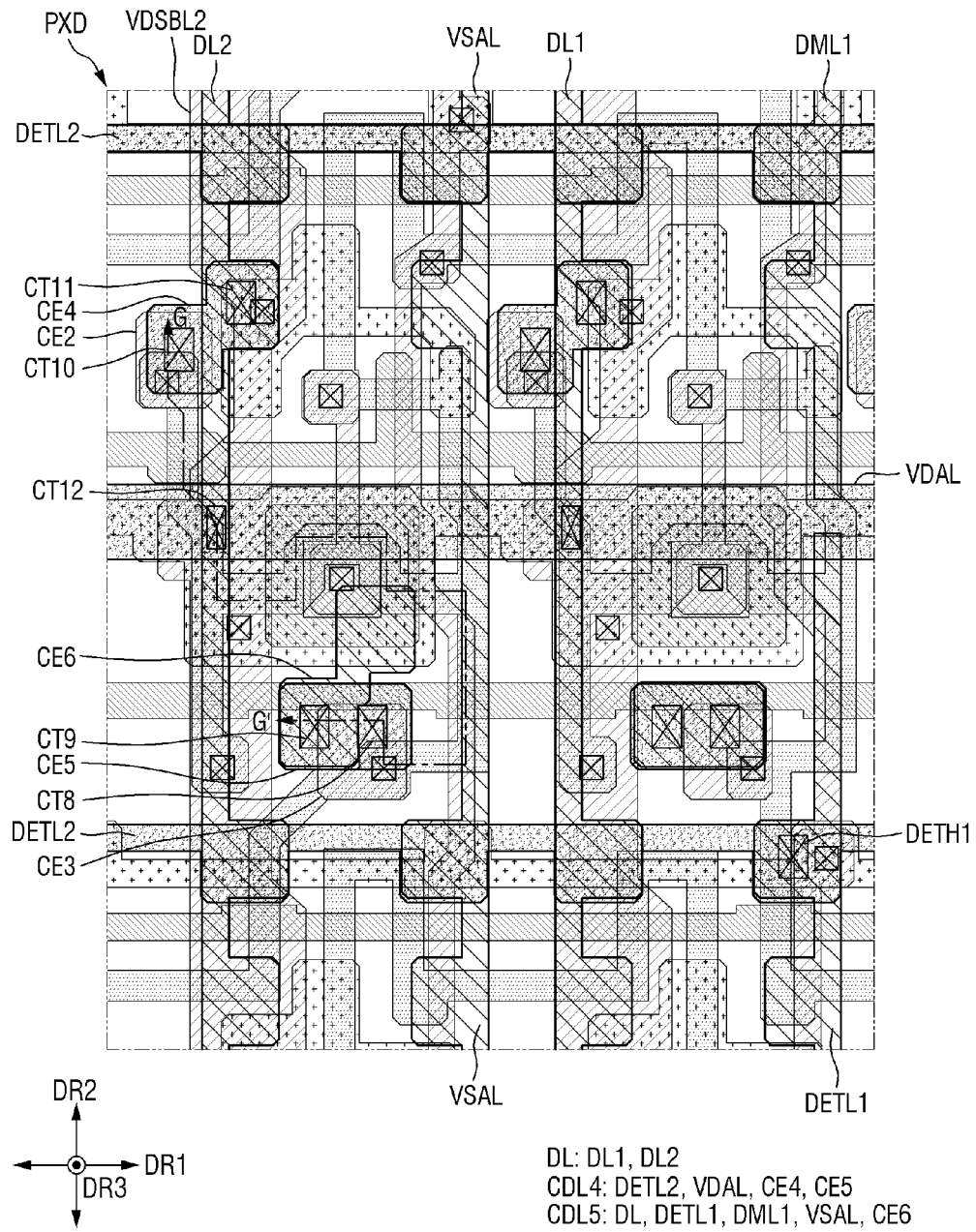
FIG. 9 is a plan view showing an example of two adjacent pixel drivers.
Figure 10:
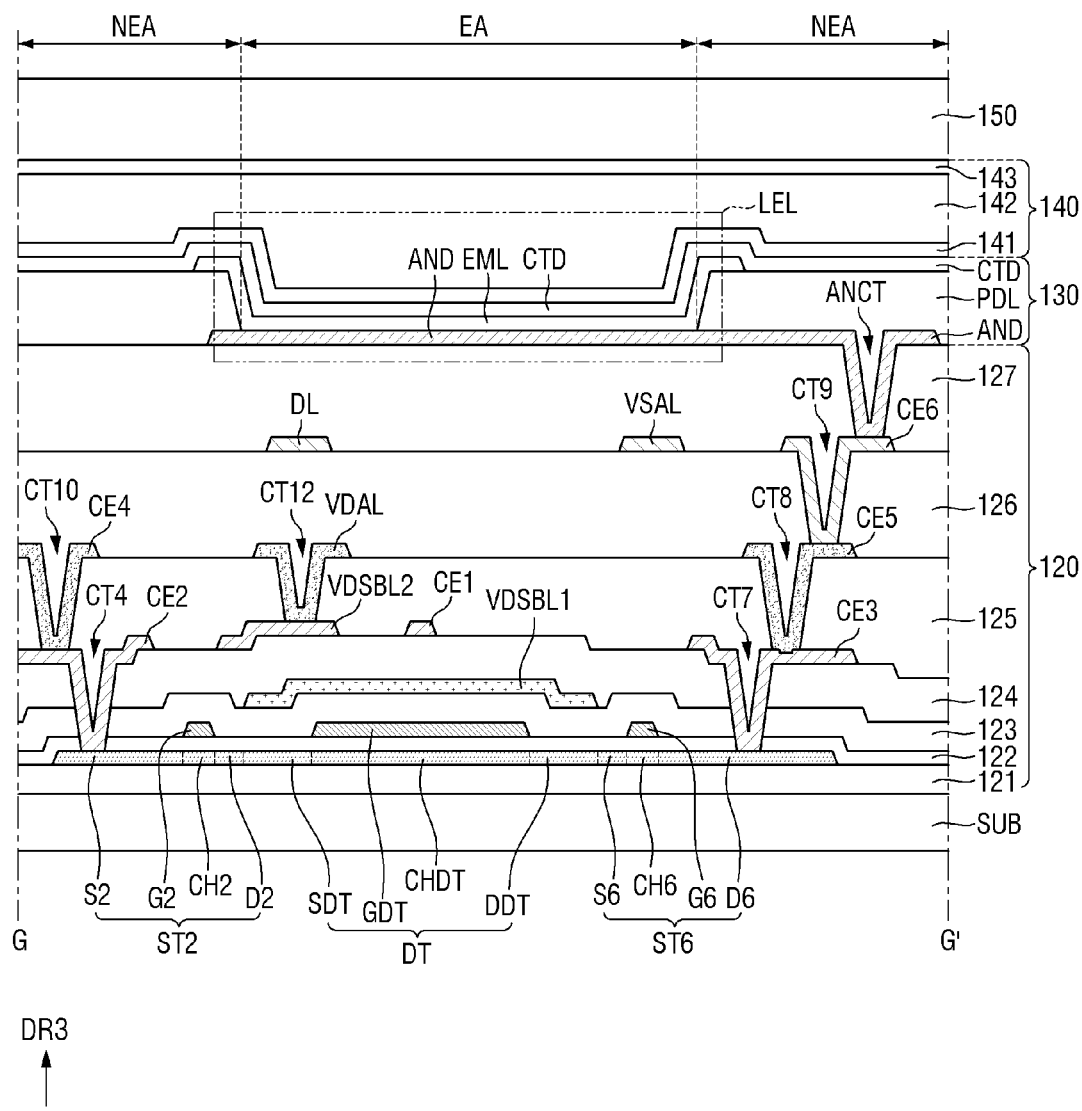
FIG. 10 is a cross-sectional view showing an example, taken along line G-G' of FIGS. 8 and 9.

FIG. 8 is a plan view showing an example of a semiconductor layer, a first conductive layer, a second conductive layer and a third conductive layer of two adjacent pixel drivers of FIG. 5. FIG. 9 is a plan view showing an example of two adjacent pixel drivers. FIG. 10 is a cross-sectional view showing an example, taken along line G-G' of FIGS. 8 and 9.

In an embodiment, referring to FIGS. 8 to 10, the circuit array layer 120 of the display device 10 may have a structure that includes a semiconductor layer SEL (see FIG. 8) on a substrate 110; a first conductive layer CDL1 (see FIG. 8) on a first gate dielectric layer 122 (see FIG. 10) covering the semiconductor layer SEL; a second conductive layer CDL2 (see FIG. 8) on a second gate dielectric layer 123 (see FIG. 10) covering a first conductive layer CDL1; a third conductive layer CDL3 (see FIG. 8) on an interlayer dielectric layer 124 (see FIG. 10) covering the second conductive layer CDL2; a fourth conductive layer CDL4 (see FIG. 9) on a first planarization layer 125 (see FIG. 10) covering the third conductive layer CDL3; a fifth conductive layer CDL5 on a second planarization layer 126 (see FIG. 10) covering the fourth conductive layer CDL4; a third planarization layer 127 (see FIG. 10) covering the fifth conductive layer CDL5.

In addition, a light-emitting array layer 130 may be disposed on the third planarization layer 127.

FIG. 8 shows the semiconductor layer SEL, the first conductive layer CDL1, the second conductive layer CDL2, and the third conductive layer CDL3 of the pixel driver PXD corresponding to the equivalent circuit diagram of FIG. 6. FIG. 9 shows the fourth conductive layer CDL4 and the fifth conductive layer CDL5 of the pixel driver PXD corresponding to the equivalent circuit diagram of FIG. 6 in conjunction with FIG. 8.

Referring to FIG. 8, the semiconductor layer SEL may include channel regions CHDT, CH1-1, CH1-2, CH2, CH3-1, CH3-2, CH4, CH5 and CH6, source electrodes SDT, S1-1, S1-2, S2, S3-1, S3-2, S4, S5 and S6, and drain electrode DDT, D1-1, D1-2, D2, D3-1, D3-2, D4, D5 and D6 of the driving transistor DT and the first to sixth transistors ST1 to ST6.

The first conductive layer CDL1 may include the gate electrodes GDT, G1-1, G1-2, G2, G3-1, G3-2, G4, G5 and G6 of the driving transistor DT and the first to sixth transistors ST1 to ST6.

In addition, the first conductive layer CDL1 may further include scan lines connected to the gate electrodes GDT, G1-1, G1-2, G2, G3-1, G3-2, G4, G5 and G6 of the first to sixth transistors ST1 to ST6, i.e., a write scan line GWL, an initialization scan line GIL, an emission control line ECL, and a control scan line GCL. The write scan line GWL, the initialization scan line GIL, the emission control line ECL and the control scan line GCL extend in the first direction DR1.

The second conductive layer CDL2 may include a gate initialization voltage line VGIL connected to the drain electrode D3-2 of the third transistor ST3 to transfer the first initialization voltage; and an anode initialization voltage line VAIL connected to the drain electrode D4 of the fourth transistor ST4 to transfer the second initialization voltage. The gate initialization voltage line VGIL and the anode initialization voltage line VAIL may extend in the first direction DR1.

The first voltage line VDL may include a first voltage horizontal auxiliary line VDSBL1 extending in the first direction DR1, and a second voltage vertical auxiliary line VDSBL2 extending in the second direction DR2.

The second conductive layer CDL2 may further include the first voltage horizontal auxiliary line VDSBL1.

The third conductive layer CDL3 may include the second voltage vertical auxiliary line VDSBL2.

The third conductive layer CDL3 may further include a gate initialization voltage auxiliary line VGIAL and an anode initialization voltage auxiliary line VAIAL.

The gate initialization voltage auxiliary line VGIAL may be electrically connected to the gate initialization voltage line VGIL and may extend in the second direction DR2.

The anode initialization voltage auxiliary line VAIAL may be electrically connected to the anode initialization voltage line VAIL and may extend in the second direction DR2.

The first voltage vertical auxiliary line VDSBL2 may be electrically connected to the first voltage horizontal auxiliary line VDSBL1.

In such an embodiment, the driving transistor DT may include a channel region CHDT, a source electrode SDT and a drain electrode DDT connected to opposing sides of the channel region CHDT, and a gate electrode DTG overlapping with the channel region CHDT.

The source electrode SDT of the driving transistor DT may be connected to the drain electrode D2 of the second transistor ST2 and the drain electrode D5 of the fifth transistor ST5.

The drain electrode DDT of the driving transistor DT may be connected to the source electrode S1-1 of a firs first transistor ST1-1 of the first transistor ST1 and the source electrode S6 of the sixth transistor ST6.

The channel region CHDT, the source electrode SDT and the drain electrode DDT of the driving transistor DT may be formed of (or defined by portions of) the semiconductor layer SEL. The source electrode SDT and the drain electrode DDT may be formed by doping ions or impurities into the semiconductor material of the semiconductor layer SEL so that they become conductive.

The gate electrode GDT of the driving transistor DT may be formed of the first conductive layer CDL1.

The first transistor ST1 may include the firs first transistor ST1-1 and a second first transistor ST1-2 connected in series with each other.

The firs first transistor ST1-1 may include a channel region CH1-1, a source electrode S1-1 and a drain electrode D1-1 connected to opposing sides of the channel region CH1-1, and a gate electrode G1-1 overlapping with the channel region CH1-1 and formed of a part of the write scan line GWL.

The source electrode S1-1 of the firs first transistor ST1-1 may be connected to the drain electrode DDT of the driving transistor DT.

The drain electrode D1-1 of the firs first transistor ST1-1 may be connected to the source electrode S1-2 of the second first transistor ST1-2.

The second first transistor ST1-2 may include a channel region CH1-2, a source electrode S1-2 and a drain electrode D1-2 connected to opposing sides of the channel region CH1-2, and a gate electrode G1-2 overlapping with the channel region CH1-2 and formed of a protrusion of the write scan line GWL.

The source electrode S1-2 of the second first transistor ST1-2 may be connected to the drain electrode D1-1 of the firs first transistor ST1-1.

The drain electrode D1-2 of the second first transistor ST1-2 may be connected to the source electrode S3-1 of the first third transistor ST3-1.

The channel region CH1-1, the source electrode S1-1 and the drain electrode D1-1 of the firs first transistor ST1-1, and the channel region CH1-2, the source electrode S1-2 and the drain electrode D1-2 of the second first transistor ST1-2 may be formed of the semiconductor layer SEL. The source electrodes S1-1 and S1-2 and the drain electrodes D1-1 and D1-2 of each of the firs first transistors ST1-1 and the second first transistors ST1-2 may be formed by doping ions or impurities into the semiconductor material of the semiconductor layer SEL so that the doped portions thereof become conductive.

The gate electrodes G1-1 and G1-2 of the firs first transistor ST1-1 and the second first transistor ST1-2 may be formed of different parts of the write scan line GWL formed of the first conductive layer CDL1.

The gate electrode DTG of the driving transistor DT may be connected to a first connection electrode CE1 through a first contact hole CT1, and the first connection electrode CE1 may be connected to the drain electrode D1-2 of the second first transistor ST1-2 through a second contact hole CT2.

The first connection electrode CE1 may be formed of the third conductive layer CDL3.

The second transistor ST2 may include a channel region CH2, a source electrode S2 and a drain electrode D2 connected to opposing sides of the channel region CH2, and a gate electrode G2 overlapping with the channel region CH2 and formed of another part of the write scan line GWL.

The source electrode S2 of the second transistor ST2 may be connected to a second connection electrode CE2 through a fourth contact hole CT4.

The drain electrode D2 of the second transistor ST2 may be connected to the source electrode SDT of the driving transistor DT and the drain electrode D5 of the fifth transistor ST5.

The channel region CH2, the source electrode S2 and the drain electrode D2 of the second transistor ST2 may be formed of the semiconductor layer SEL. The source electrode S2 and the drain electrode D2 may be formed by doping ions or impurities into the semiconductor material of the semiconductor layer SEL so that the doped portions thereof become conductive.

The gate electrode G2 of the second transistor ST2 may be formed of a part of the write scan line GWL formed of the first conductive layer CDL1.

The second connection electrode CE2 may be formed of the third conductive layer CDL3.

The third transistor ST3 may include a first third transistor ST3-1 and a second third transistor ST3-2 connected in series with each other.

The first third transistor ST2 may include a channel region CH3-1, a source electrode S3-1 and a drain electrode D3-1 connected to opposing sides of the channel region CH3-1, and a gate electrode G3-1 overlapping with the channel region CH3-1.

The source electrode S3-1 of the first third transistor ST3-1 may be connected to the drain electrode D1-2 of the second first transistor ST1-2.

The drain electrode D3-1 of the first third transistor ST3-1 may be connected to the source electrode S3-2 of the second third transistor ST3-2.

The second third transistor ST3-2 may include a channel region CH3-2, a source electrode S3-2 and a drain electrode D3-2 connected to opposing sides of the channel region CH3-2, and a gate electrode G3-2 overlapping with the channel region CH3-2.

The drain electrode D3-2 of the second third transistor ST3-2 may be connected to a gate initialization auxiliary line VGIAL through the second initialization contact hole VICH2.

The channel region CH3-1, the source electrode S3-1 and the drain electrode D3-1 of the first third transistor ST3-1, and the channel region CH3-2, the source electrode S3-2 and the drain electrode D3-2 of the second third transistor ST3-2 may be formed of the semiconductor layer SEL. The source electrodes S3-1 and S3-2 and the drain electrodes D3-1 and D3-2 of the first third transistors ST3-1 and the second third transistors ST3-2 may be formed by doping ions or impurities into the semiconductor material of the semiconductor layer SEL so that the doped portions thereof become conductive.

The gate electrodes G3-1 and G3-2 of the first third transistor ST3-1 and the second third transistor ST3-2 may be formed of different parts of the initialization scan line GIL formed of the first conductive layer CDL1.

The circuit array layer 120 may further include a shielding electrode SHE overlapping with at least a part of the source electrode S3-1 of the second third transistor ST3-2.

The shielding electrode SHE may be formed of the second conductive layer CDL2.

The shielding electrode SHE may be connected to the first voltage vertical auxiliary line VDSBL2 through a third contact hole CT3.

The shielding electrode SHE may further overlap with a part of the drain electrode D1-1 of the firs first transistor ST1-1.

The first voltage vertical auxiliary line VDSBL2 may be connected to the first voltage horizontal auxiliary line VDSBL1 through a fifth contact hole CT5.

The fourth transistor ST4 may include a channel region CH4, a source electrode S4 and a drain electrode D4 connected to both sides of the channel region CH4, and a gate electrode G4 overlapping with the channel region CH4 and formed of a part of the write scan line GWL.

The source electrode S4 of the fourth transistor ST4 may be connected to the drain electrode D6 of the sixth transistor ST6.

The drain electrode D4 of the fourth transistor ST4 may be connected to an anode initialization auxiliary line VAIAL through a fourth initialization contact hole VACH2.

The channel region CH4, the source electrode S4 and the drain electrode D4 of the fourth transistor ST4 may be formed of the semiconductor layer SEL. The source electrode S4 and the drain electrode D4 may be formed by doping ions or impurities into the semiconductor material of the semiconductor layer SEL so that the doped portions thereof become conductive.

The gate electrode G4 of the fourth transistor ST4 may be formed of a part of the control scan line GCL formed of the first conductive layer CDL1.

The fifth transistor ST5 may include a channel region CH5, a source electrode S5 and a drain electrode D5 connected to opposing sides of the channel region CH5, and a gate electrode G5 overlapping with the channel region CH5 and formed of a part of the emission control line ECL.

The source electrode S5 of the fifth transistor ST5 may be connected to a first voltage vertical auxiliary line VDSVL2 through a sixth contact hole CT6.

The drain electrode D5 of the fifth transistor ST5 may be connected to the source electrode SDT of the driving transistor DT.

The sixth transistor ST6 may include a channel region CH6, a source electrode S6 and a drain electrode D6 connected to opposing sides of the channel region CH6, and a gate electrode G6 overlapping with the channel region CH5 and formed of another part of the emission control line ECL.

The source electrode S6 of the sixth transistor ST6 may be connected to the drain electrode DDT of the driving transistor DT.

The drain electrode D6 of the sixth transistor ST6 may be connected to the source electrode S4 of the fourth transistor ST4, and may be connected to a third connection electrode CE3 through a seventh contact hole CT7.

The third connection electrode CE3 may be formed of the third conductive layer CDL3.

The channel region CH5, the source electrode S5 and the drain electrode D5 of the fifth transistor ST5 may be formed of the semiconductor layer SEL. The source electrode S5 and the drain electrode D5 may be formed by doping ions or impurities into the semiconductor material of the semiconductor layer SEL so that the doped portions thereof become conductive.

The channel region CH6, the source electrode S6 and the drain electrode D6 of the sixth transistor ST6 may be formed of the semiconductor layer SEL. The source electrode S6 and the drain electrode D6 may be formed by doping ions or impurities into the semiconductor material of the semiconductor layer SEL so that the doped portions thereof become conductive.

The gate electrodes G5 and G6 of the fifth and sixth transistors ST5 and ST6 may be formed of different parts of the emission control line ECL formed of the first conductive layer CDL1, respectively.

The capacitor C1 may be formed or defined by the first capacitor electrode CAE1 and the second capacitor electrode CAE2 which overlap each other.

The first capacitor electrode CAE1 may be formed of a part of the gate electrode GDT of the driving transistor DT formed of the first conductive layer CDL1.

The second capacitor electrode CAE2 may be formed of a part of the first voltage horizontal auxiliary line VDSBL1 formed of the second conductive layer CDL2.

The second connection electrode CE2 is connected to the source electrode S2 of the second transistor ST2 through the fourth contact hole CT4.

Referring to FIG. 9, each of the second detour line DETL2, the second dummy line DML2, the first voltage auxiliary line VDAL and the second voltage sub-line VSSBL (see FIG. 17) may extend in the first direction DR1 and may be formed of the fourth conductive layer CDL4.

In addition, each of the data line DL, the first detour line DETL1, the third detour line DELT3, the first dummy line DML1 and the second voltage auxiliary line VSAL may extend in the second direction DR2 and may be formed of the fifth conductive layer CDL5.

The fourth connection electrode CE4 may formed of the fourth conductive layer CDL4 and may be connected to the second connection electrode CE2 through a tenth contact hole CT10.

The data line DL formed of the fifth conductive layer CDL5 may be connected to a fourth connection electrode CE4 through an eleventh contact hole CT11.

Accordingly, the source electrode S2 of the second transistor ST2 may be connected to the data line DL through the second connection electrode CE2 and the fourth connection electrode CE4.

The first voltage auxiliary line VDAL may be electrically connected to the first voltage vertical auxiliary line VDSBL2 of the third conductive layer CDL3 through a twelfth contact hole CT12.

As shown in FIG. 8, the third connection electrode CE3 formed of the third conductive layer CDL3 may be connected to a source electrode S4 of the fourth transistor ST4 and a drain electrode D6 of the sixth transistor ST6 formed of the semiconductor layer SEL through the seventh contact hole CT7.

As shown in FIG. 9, a fifth connection electrode CE5 formed of the fourth conductive layer CDL4 may be connected to the third connection electrode CE3 through an eighth contact hole CTB.

A sixth connection electrode CE6 formed of the fifth conductive layer CDL5 may be connected to the fifth connection electrode CE5 through a ninth contact hole CT9.

Accordingly, the sixth connection electrode CE6 may be connected to the source electrode S4 of the fourth transistor ST4 and the drain electrode S of the sixth transistor ST6 through the third connection electrode CE3 and the fifth connection electrode CE5.

The sixth connection electrode CE6 may be connected to the anode electrode of the light-emitting element LEL through an anode contact hole ANCT (see FIG. 10) penetrating the third planarization layer 127.

The first detour line DETL1 extending in the second direction DR2 and formed of the fifth conductive layer CDL5 may be connected to the second detour line DETL2 extending in the first direction DR1 and formed of the fourth conductive layer CDL4 through a first detour connection hole DETH1.

As shown in FIG. 10, the circuit array layer 120 may include the semiconductor layer SEL on the substrate 110; the first conductive layer CDL1 on the first gate dielectric layer 122 that covers the semiconductor layer SEL; the second conductive layer CDL2 on the second gate dielectric layer 123 that covers the first conductive layer CDL1; the third conductive layer CDL3 on the interlayer dielectric layer 124 that covers the second conductive layer CDL2; the fourth conductive layer CDL4 on the first planarization layer 125 that covers the third conductive layer CDL3; the fifth conductive layer CDL5 on the second planarization layer 126 that covers the fourth conductive layer CDL4; and the third planarization layer 127 covering the fifth conductive layer CDL5.

The circuit array layer 120 may further include a buffer layer 121 disposed between the substrate 110 and the semiconductor layer SEL.

The buffer layer 121 may protect the circuit array layer 120 and the light-emitting array layer 130 from moisture permeating through the substrate 110, and may include or be made up of (or defined by) at least one inorganic film.

In an embodiment, for example, the buffer layer 121 may include or be made up of multiple films in which one or more inorganic films of silicon nitride, silicon oxynitride, silicon oxide, titanium oxide or aluminum oxide are alternately stacked on one another.

The semiconductor layer SEL may be disposed on the buffer layer 121 and may include or be made of silicon semiconductor such as polycrystalline silicon, monocrystalline silicon, low-temperature polycrystalline silicon, and amorphous silicon.

The semiconductor layer SEL may include the channel regions CHDT, CH1-1, CH1-2, CH2, CH3-1, CH3-2, CH4, CH5 and CH6 of the driving transistor DT and the switch elements ST1 to ST6 disposed in the pixel driver PXD.

In addition, the semiconductor layer SEL may further include the source electrodes SDT, S1-1, S1-2, S2, S3-1, S3-2, S3-2, S4, S5 and S6 and drain electrodes DDT, D1-1, D1-2, D2, D3-1, D3-2, D4, D5 and D6 of the driving transistor DT and the switch elements ST1 to ST6 (see FIG. 8).

Other parts of the semiconductor layer SEL that are associated with the source electrodes SDT, S1-1, S1-2, S2, S3-1, S3-2, S3-2, S4, S5 and S6 and drain electrodes DDT, D1-1, D1-2, D2, D3-1, D3-2, D4, D5 and D6 of the driving transistor DT and the switch elements ST1 to ST6 may be doped with ions or impurities to be conductive.

In such an embodiment, parts of the semiconductor layer SEL that are associated with the channel regions CHDT, CH1-1, CH1-2, CH2, CH3-1, CH3-2, CH4, CH5 and CH6 of the driving transistor DT and the switch elements ST1 to ST6 (see FIG. 8) are not doped by the gate electrodes GDT, G1-1, G1-2, G2, G3-1, G3-2, G4, G5 and G6, to maintain the characteristics of a semiconductor, which forms a channel as paths of carriers depending on a potential difference.

The first gate dielectric layer 122 may be disposed on the buffer layer 121 and may include or be made up of an inorganic film covering the semiconductor layer SEL.

In an embodiment, for example, the first gate dielectric layer 122 may include or be made up of an inorganic film of a silicon nitride layer, a silicon oxynitride layer, a silicon oxide layer, a titanium oxide layer, or an aluminum oxide layer.

The first conductive layer CDL1 is disposed on the first gate dielectric layer 122.

The first conductive layer CDL1 may include the gate electrodes GDT, G1-1, G1-2, G2, G3-1, G3-2, G4, G5 and G6 of the driving transistor DT and the switch elements ST1 to ST6 disposed in the pixel driver PXD.

In addition, the first conductive layer CDL1 may further include the write scan line GWL, the initialization scan line GIL, the control scan line GCL and the emission control line ECL that are connected to the gate electrodes G1-1, G1-2, G2, G3-1, G3-2, G4, G5 and G6 of the first to sixth transistors ST1 to ST6 disposed in the pixel driver PXD and extending in the first direction DR1.

The first conductive layer CDL1 may include or be made up of a single layer or multiple layers of at least one selected from molybdenum (Mo), aluminum (Al), chromium (Cr), gold (Au), titanium (Ti), nickel (Ni), neodymium (Nd) and copper (Cu) or an alloy thereof.

The second gate dielectric layer 123 may be disposed on the first gate dielectric layer 122 and may include or be made of an inorganic film covering the first conductive layer CDL1.

In an embodiment, for example, the second gate dielectric layer 123 may include or be made up of an inorganic film of a silicon nitride layer, a silicon oxynitride layer, a silicon oxide layer, a titanium oxide layer, or an aluminum oxide layer.

The second conductive layer CDL2 is disposed on the second gate dielectric layer 123.

The second conductive layer CDL2 may include the shielding electrode SHE, the first voltage horizontal auxiliary line VDSBL1, the gate initialization voltage line VGIL, and the anode initialization voltage line VAIL.

The second conductive layer CDL2 may include or be made up of a single layer or multiple layers of at least one selected from molybdenum (Mo), aluminum (Al), chromium (Cr), gold (Au), titanium (Ti), nickel (Ni), neodymium (Nd) and copper (Cu) or an alloy thereof.

The interlayer dielectric layer 124 may be disposed on the second gate dielectric layer 123 and may include or be made of an inorganic film covering the second conductive layer CDL2.

In an embodiment, for example, the interlayer dielectric layer 124 may include or be made of an inorganic film of a silicon nitride layer, a silicon oxynitride layer, a silicon oxide layer, a titanium oxide layer, or an aluminum oxide layer.

The third conductive layer CDL3 is disposed on the interlayer dielectric layer 124.

The third conductive layer CDL3 may include the first connection electrode CE1, the second connection electrode CE2, the third connection electrode CE3, the first voltage vertical auxiliary line VDSBL2, the gate initialization voltage auxiliary line VGIAL, and the anode initialization voltage auxiliary line VAIAL.

Referring to FIGS. 8 and 10, the first contact hole CT1, the second contact hole CT2, the third contact hole CT3, the fourth contact hole CT4, the fifth contact hole CT5, the sixth contact hole CT6 and the seventh contact hole CT7 may be defined in the pixel driver PXD.

The first contact hole CT1 is for connecting the first connection electrode CE1 and the gate electrode GDT of the driving transistor DT to each other.

The first contact hole CT1 may be associated with a part of the gate electrode GDT of the driving transistor DT and may be defined through the second gate dielectric layer 123 and the interlayer dielectric layer 124. Accordingly, the first connection electrode CE1 formed of the third conductive layer CDL3 may be electrically connected to the gate electrode GDT of the driving transistor DT formed of the first conductive layer CDL1 through the first contact hole CT1.

The second contact hole CT2 is for connecting one of the drain electrode D1-2 of the second first transistor ST1-2 and the source electrode S3-1 of the first third transistor ST3-1 and the first connection electrodes CE1 to each other. The drain electrode D1-2 of the second first transistor ST1-2 and the source electrode S3-1 of the first third transistor ST3-1 are connected with each other.

The second contact hole CT2 may be associated with one of the drain electrode D1-2 of the second first transistor ST1-2 and the source electrode S3-1 of the first third transistor ST3-1 and may be defined through the first gate dielectric layer 122, the second gate dielectric layer 123 and the interlayer dielectric layer 124. Accordingly, the first connection electrode CE1 formed of the third conductive layer CDL3 may be electrically connected to the drain electrode D1-2 of the second first transistor ST1-2 and the source electrode S3-1 of the first third transistor ST3-1 formed of the semiconductor layer SEL through the second contact hole CT2.

In addition, the gate electrode GDT of the driving transistor DT may be electrically connected to the drain electrode D1-2 of the second first transistor ST1-2 and the source electrode S3-1 of the first third transistor ST3-1 through the first contact hole CT1, the second contact hole CT2 and the first connection electrode CE1.

The third contact hole CT3 is for connecting the shielding electrode SHE and the first voltage vertical auxiliary line VDSBL2 to each other.

The third contact hole CT3 may be associated with a part of the first voltage vertical auxiliary line VDSBL2 and may be defined through the interlayer dielectric layer 124. Accordingly, the shielding electrode SHE formed of the second conductive layer CDL2 may be electrically connected to the first voltage vertical auxiliary line VDSBL2 formed of the third conductive layer CDL3 through the third contact hole CT3.

The fourth contact hole CT4 is for connecting the second connection electrode CE2 and the source electrode S2 of the second transistor ST2 to each other.

The fourth contact hole CT4 may be associated with a part of the source electrode S2 of the second transistor ST2, and may be defined through the first gate dielectric layer 122, the second gate dielectric layer 123, and the interlayer dielectric layer 124. Accordingly, the second connection electrode CE2 formed of the third conductive layer CDL3 may be electrically connected to the source electrode S2 of the second transistor ST2 formed of the semiconductor layer SEL through the fourth contact hole CT4.

The fifth contact hole CT5 is for connecting the first voltage horizontal auxiliary line VDSBL1 and the first voltage vertical auxiliary line VDSBL2 to each other.

The fifth contact hole CT5 may be associated with a part of the first voltage horizontal auxiliary line VDSBL1 and may be defined through the interlayer dielectric layer 124. Accordingly, the first voltage vertical auxiliary line VDSBL2 formed of the third conductive layer CDL3 may be electrically connected to the first voltage horizontal auxiliary line VDSBL1 formed of the second conductive layer CDL2 through the fifth contact hole CT5.

The sixth contact hole CT6 is for connecting the first voltage vertical auxiliary line VDSBL2 and the source electrode S5 of the fifth transistor ST5 to each other.

The sixth contact hole CT6 may be associated with a part of the source electrode S5 of the fifth transistor ST5, and may be defined through the first gate dielectric layer 122, the second gate dielectric layer 123, and the interlayer dielectric layer 124. Accordingly, the first voltage vertical auxiliary line VDSBL2 formed of the third conductive layer CDL3 may be electrically connected to the source electrode S5 of the fifth transistor ST5 formed of the semiconductor layer SEL through the sixth contact hole CT6.

The seventh contact hole CT7 is for connecting the third connection electrode CE3 and the drain electrode D5 of the fifth transistor ST5 to each other.

The seventh contact hole CT7 may be associated with a part of the drain electrode D5 of the fifth transistor ST5, and may be defined through the first gate dielectric layer 122, the second gate dielectric layer 123, and the interlayer dielectric layer 124. Accordingly, the third connection electrode CE3 formed of the third conductive layer CDL3 may be electrically connected to the drain electrode D5 of the fifth transistor ST5 formed of the semiconductor layer SEL through the seventh contact hole CT7.

The third conductive layer CDL3 may have a multi-layer structure including a low-resistance metal layer and metal layers disposed on and under the low-resistance metal layer, respectively, which can prevent diffusion of ions.

In an embodiment, for example, the third conductive layer CDL3 may have a stack structure of metal layers, and each of the metal layers of the third conductive layer CDL3 may include or be made of at least one selected from molybdenum (Mo), aluminum (Al), chromium (Cr), gold (Au), titanium (Ti), nickel (Ni), neodymium (Nd) and copper (Cu).

In an embodiment, the low resistance metal layer may include or be made of at least one selected from aluminum (Al), chromium (Cr), gold (Au), nickel (Ni), neodymium (Nd) and copper (Cu).

The metal layers that can prevent diffusion of ions may include or be made of titanium (Ti).

In an embodiment, for example, the third conductive layer CDL3 may have a stack structure (Ti/Al/Ti) of titanium (Ti)/aluminum (Al)/titanium (Ti).

The first planarization layer 125 covering the third conductive layer CDL3 may be formed of an organic film including an organic material such as an acryl resin, an epoxy resin, a phenolic resin, a polyamide resin or a polyimide resin.

The fourth conductive layer CDL4 is disposed on the first planarization layer 125.

As shown in FIG. 9, the fourth conductive layer CDL4 may include the second voltage sub-line VSSBL (see FIG. 17), the second detour line DETL2, the second dummy line DML2, the first voltage auxiliary line VDAL, the fourth connection electrode CE4 and the fifth connection electrode CE5.

The fourth conductive layer CDL4 may include or be made up of a single layer or multiple layers of at least one selected from molybdenum (Mo), aluminum (Al), chromium (Cr), gold (Au), titanium (Ti), nickel (Ni), neodymium (Nd) and copper (Cu) or an alloy thereof.

Like the third conductive layer CDL3, the fourth conductive layer CDL4 may have a stack structure of metal layers, and each of the metal layers of the third conductive layer CDL3 may be made of at least one selected from molybdenum (Mo), aluminum (Al), chromium (Cr), gold (Au), titanium (Ti), nickel (Ni), neodymium (Nd) and copper (Cu).

In an embodiment, for example, the fourth conductive layer CDL4 may have a stack structure (Ti/Al/Ti) of titanium (Ti)/aluminum (Al)/titanium (Ti).

The second planarization layer 126 covering the fourth conductive layer CDL4 may be formed of an organic film including an organic material such as an acryl resin, an epoxy resin, a phenolic resin, a polyamide resin or a polyimide resin.

The fifth conductive layer CDL5 is disposed on the second planarization layer 126.

As shown in FIG. 9, the fifth conductive layer CDL5 may include the data lines DL, the first detour line DETL1, the third detour line DETL3, the first dummy line DML1, the second voltage auxiliary line VSAL, and the sixth connection electrode CE6.

The fifth conductive layer CDL5 may be made up of a single layer or multiple layers of at least one selected from molybdenum (Mo), aluminum (Al), chromium (Cr), gold (Au), titanium (Ti), nickel (Ni), neodymium (Nd) and copper (Cu) or an alloy thereof.

As shown in FIG. 10, the third planarization layer 127 covering the fifth conductive layer CDL5 may be formed of an organic film including an organic material such as an acryl resin, an epoxy resin, a phenolic resin, a polyamide resin or a polyimide resin.

Referring to FIGS. 9 and 10, the eighth contact hole CT8, the ninth contact hole CT9, the tenth contact hole CT10, and the eleventh contact hole CT11 may be further defined in the pixel driver PXD.

The eighth contact hole CT8 is for connecting the fifth connection electrode CE5 and the third connection electrode CE3 to each other.

The eighth contact hole CT8 may be in line with a part of the third connection electrode CE3 and may be defined through the first planarization layer 125. Accordingly, the fifth connection electrode CE5 formed of the fourth conductive layer CDL4 may be electrically connected to the third connection electrode CE3 formed of the third conductive layer CDL3 through the eighth contact hole CTB.

The ninth contact hole CT9 is for connecting the fifth connection electrode CE5 and the sixth connection electrode CE6 to each other.

The ninth contact hole CT9 may be associated with another part of the fifth connection electrode CE5 and may be defined through the second planarization layer 126. Accordingly, the sixth connection electrode CE6 formed of the fifth conductive layer CDL5 may be electrically connected to the fifth connection electrode CE5 formed of the fourth conductive layer CDL4 through the ninth contact hole CT9.

The tenth contact hole CT10 is for connecting the fourth connection electrode CE4 and the second connection electrode CE2 to each other.

The tenth contact hole CT10 may be associated with a part of the second connection electrode CE2 and may be defined through the first planarization layer 125. Accordingly, the fourth connection electrode CE4 formed of the fourth conductive layer CDL4 may be electrically connected to the second connection electrode CE2 formed of the third conductive layer CDL3 through the tenth contact hole CT10.

The eleventh contact hole CT11 is for connecting the fourth connection electrode CE4 and the data line DL to each other.

The eleventh contact hole CT11 may be associated with another part of the fourth connection electrode CE4 and may be defined through the second planarization layer 126. Accordingly, the data line DL formed of the fifth conductive layer CDL5 may be electrically connected to the fourth connection electrode CE4 formed of the fourth conductive layer CDL4 through the eleventh contact hole CT11.

As shown in FIG. 10, the light-emitting array layer 130 may be disposed on the third planarization layer 127 of the circuit array layer 120.

For example, the light-emitting array layer 130 may include a plurality of anode electrodes AND disposed on the third planarization layer 127, associated with the plurality of emission areas EA and electrically connected to the plurality of pixel drivers PXD, respectively, a pixel-defining layer PDL disposed on the third planarization layer 127, associated with the non-emission area NEA between the emission areas EA and covering the edges of the anode electrodes AND; a plurality of emission material layers EML associated with the emission areas EA, respectively, and disposed on the anode electrodes AND, respectively; and a cathode electrode CTD associated with the emission areas EA, disposed on the pixel-defining layer PDL and the emission layers EML and connected to the second voltage supply line VSSPL.

The anode electrode AND may be connected to the sixth connection electrode CE6 through the anode contact hole ANCT defined in the third planarization layer 127.

Accordingly, the anode electrode AND may be electrically connected to the drain electrode DDT of the driving transistor DT through the seventh contact hole CT7, the third connection electrode CE3, the eighth contact hole CT8, the fifth connection electrode CE5, the ninth contact hole CT9, the sixth connection electrode CE6 and the anode contact hole ANCT.

The pixel-defining layer PDL may be formed of an organic film.

The emission material layer EML may include an organic light-emitting material.

Although not shown in the drawings, a first common layer (not shown) including at least a hole transport material may be disposed between the anode electrode AND and the emission material layer EML.

In addition, a second common layer (not shown) including at least an electron transport material may be disposed between the emission material layer EML and the cathode electrode CTD.

The cathode electrode CTD may be disposed throughout the display area DA.

Although not shown in the drawings, the cathode electrode CTD may be connected to the second voltage supply line VSSPL in the non-display area NDA.

Accordingly, the light-emitting array layer 130 may include a plurality of light-emitting elements LEL disposed in each of the emission areas EA and each having a structure including an anode electrode AND and a cathode electrode CTD facing each other, and an emission material layer EML interposed therebetween.

The light-emitting array layer 130 may be covered with the encapsulation structure layer 140 for blocking the permeation of oxygen or moisture.

The encapsulation structure layer 140 may cover the light-emitting array layer 130 and may have a structure in which at least one inorganic film and at least one organic film are alternately stacked on one another.

In an embodiment, for example, the encapsulation structure 140 may include a first encapsulation layer 141 covering the cathode electrode CTD, in contact with the interlayer dielectric layer 124 in the non-display area NDA, and including or made of an inorganic insulating material; a second encapsulation layer 142 disposed on the first encapsulation layer 141, disposed in the display area DA and including or made of an organic insulating material; and a third encapsulation layer 143 covering the second encapsulation layer 142, in contact with the first encapsulation layer 141 in the non-display area NDA, and including or made of an inorganic insulating material.

Hereinafter, an embodiment will be described in more detail.

Figure 11:
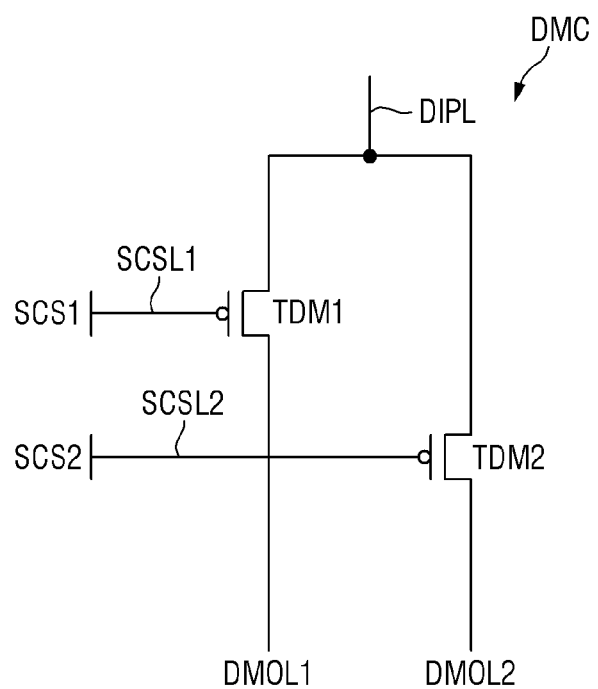
FIG. 11 is an equivalent circuit diagram showing the demux circuit of FIG. 5 according to an embodiment.

FIG. 11 is an equivalent circuit diagram showing the demux circuit of FIG. 5 according to an embodiment.

FIG. 11 shows an embodiment where the demux circuit DMC is connected to two data lines DL.

As shown in FIG. 11, one of the demux circuits DMC according to an embodiment includes two demux transistors TDM1 and TDM2 respectively associated with two output terminals.

First electrodes (e.g., source electrodes) of the two demux transistors TDM1 and TDM2 may be connected to a data input line DIPL.

Second electrodes (e.g., drain electrodes) of the two demux transistors TDM1 and TDM2 may be connected to a first data output line DOPL1 and a second data output line DOPL2, respectively.

In an embodiment, in the first demux circuit DMC1, the second electrode of the first demux transistor TDM1 may be connected to a first data line DL1 through the first data output line DOPL1, and the second electrode of the second demux transistor TDM2 may be connected to a second data line DL2 through the second data output line DOPL2.

In an embodiment, in the second demux circuit DMC2, the second electrode of the first demux transistor TDM1 may be connected to a third data line DL3 through the first data output line DOPL1, and the second electrode of the second demux transistor TDM2 may be connected to a fourth data line DL4 through the second data output line DOPL2.

A gate electrode of the first demux transistor TDM1 may be connected to the first demux control line SCSL1, and a gate electrode of the second demux transistor TDM2 may be connected to the second demux control line SCSL2.

The first demux control line SCSL1 and the second demux control line SCSL2 transmit a first demux control signal SCS1 and a second demux control signal SCS2 in different phases, respectively.

In such an embodiment, the first demux transistor TDM1 and the second demux transistor TDM2 are turned on for different periods in response to the first demux control signal SCS1 and the second demux control signal SCS2 in different phases.

Therefore, the data driving signal of the display driver circuit 200 transferred through the data input line DIPL may be time-division demultiplexed by the first demux transistor TDM1 and the second demux transistor TDM2 turned on for different periods. In this manner, the respective data signals may be transmitted to the first data line DL1 and the second data line DL2 connected to the output terminals of the demux circuit DMC for different periods.

Figure 12:
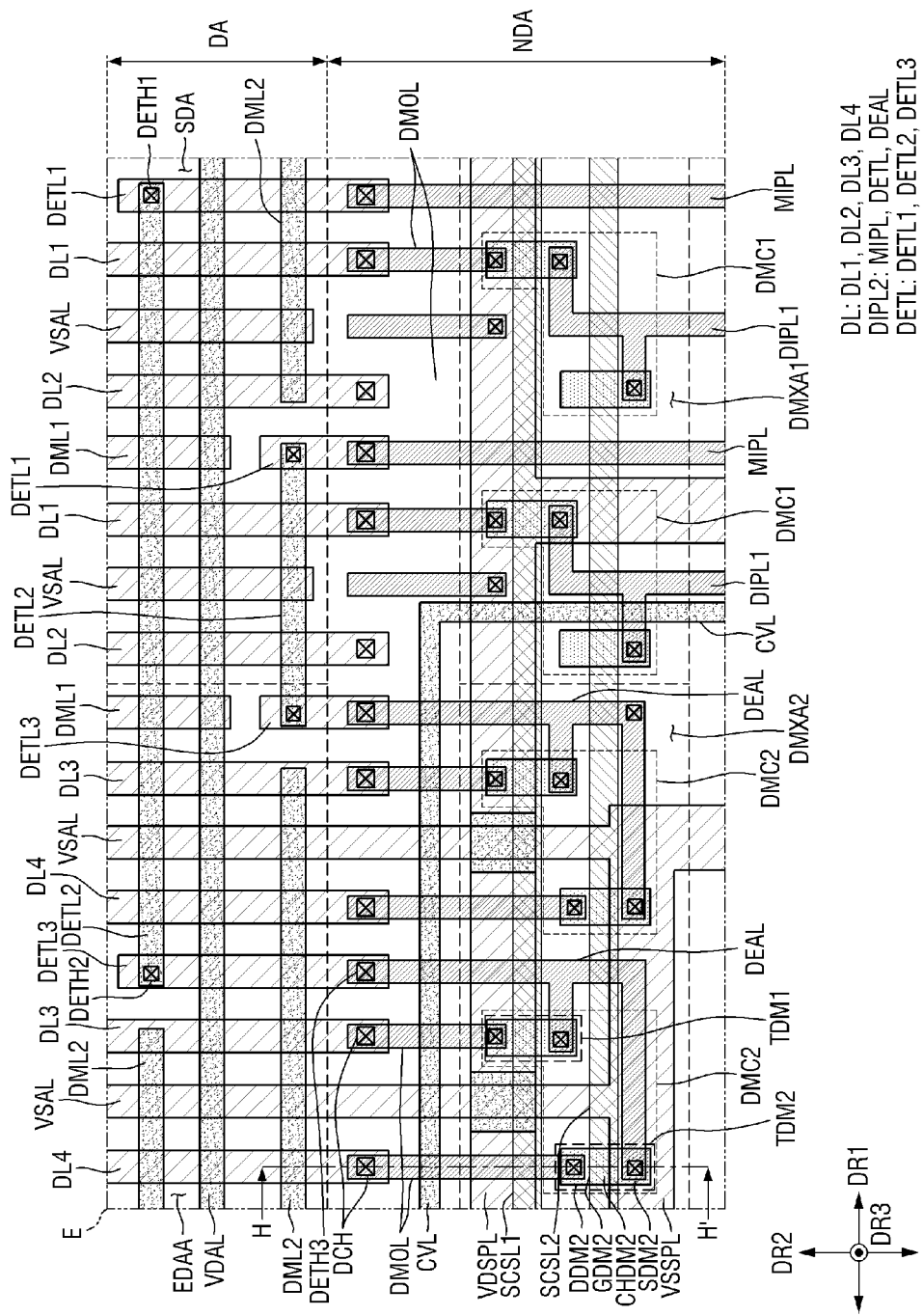
FIG. 12 is a plan view showing an example of portion E of FIG. 5.
Figure 13:
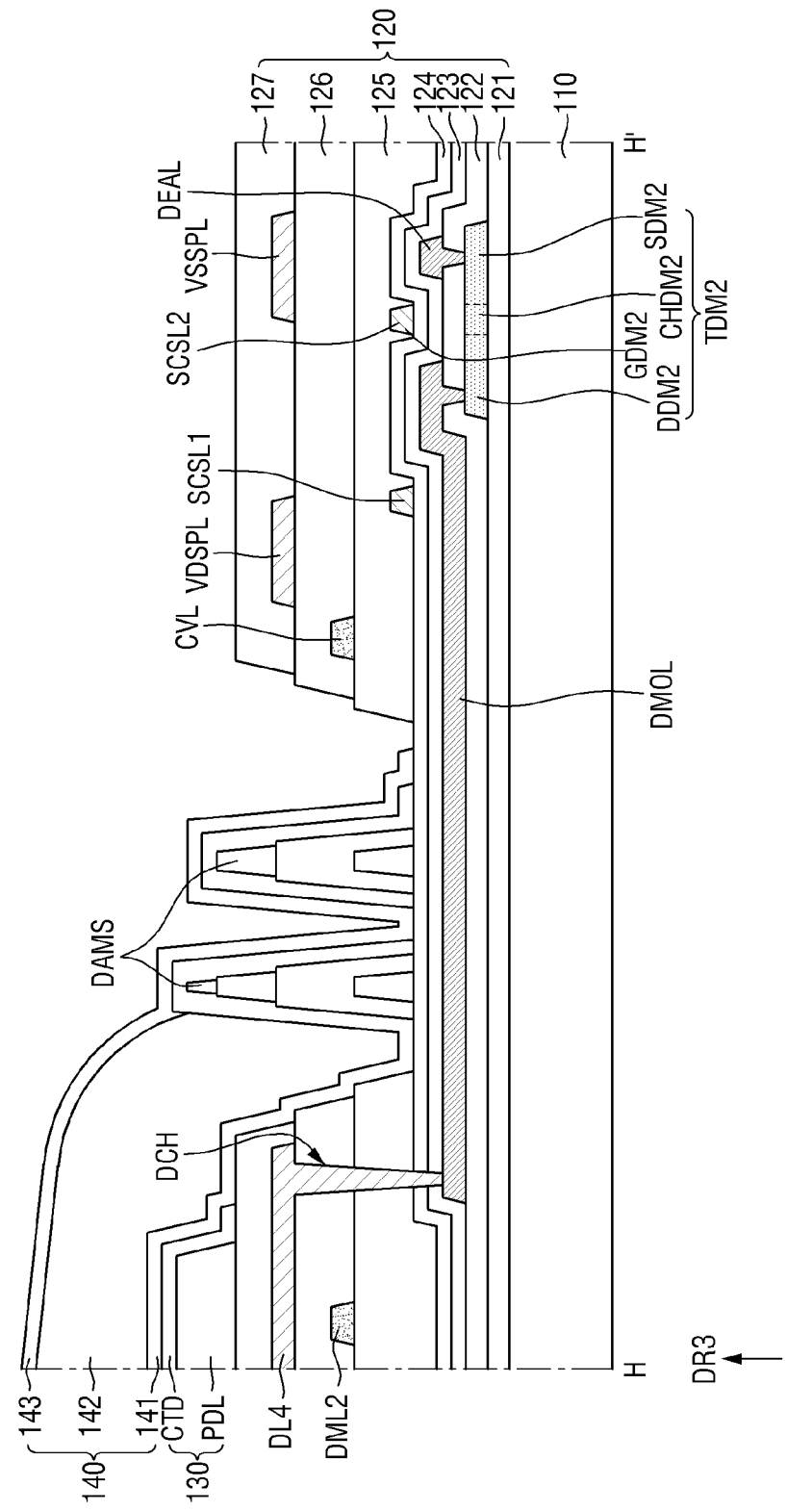
FIG. 13 is a cross-sectional view showing an example, taken along line H-H' of FIG. 12.

FIG. 12 is a plan view showing an example of portion E of FIG. 5. FIG. 13 is a cross-sectional view showing an example, taken along line H-H' of FIG. 12.

Referring to FIG. 12, each of the demux circuits DMC may be connected to two data lines DL1 and DL2 (or DL3 and DL4) adjacent to each other among the data lines DL through two data output lines DMOL.

As shown in FIG. 5, the first data input line DIPL1 connected to the input terminal of the first demux circuit DMC1 of the first demux area DMXA1 extends to the first demux area DMXA1 in the first subsidiary area SB1.

In addition, the second data input line DIPL2 connected to the input terminal of the second demux circuit DMC2 of the second demux areas DMXA2 includes a main input line MIPL extending from the first subsidiary area SB1 to the first demux area DMXA1, a demux detour line DETL disposed in the demux adjacent area DAA of the display area DA, and a detour additional line DEAL disposed in the second demux areas DMXA2.

As shown in FIG. 12, in the first demux area DMXA1, the main input line MIPL may be disposed parallel to the first data input line DIPL1.

The demux detour lines DETL may include the first detour line DETL1 extending in the second direction DR2 and disposed in the center adjacent area CDAA, the second detour line DETL2 extending in the first direction DR1 and disposed in the demux adjacent area DAA, and the third detour line DETL3 extending in the second direction DR2 and disposed in the edge adjacent area EDAA.

In an embodiment, the data lines DL may include a first data line DL1 and a second data line DL2 connected to the first demux circuit DMC1 and disposed in the center adjacent area CDAA, and a third data line DL3 and a fourth data line DL4 connected to the second demux circuit DMC2 and disposed in the edge adjacent area EDAA.

In such an embodiment, the first data line DL1 may be adjacent to the first detour line DETL1, and the second data line DL2 may be adjacent to the second voltage auxiliary line VSAL.

In such an embodiment, the third data line DL3 may be adjacent to the third detour line DETL4, and the fourth data line DL4 may be adjacent to the second voltage auxiliary line VSAL.

As shown in FIG. 13, each of the data lines DL, the first detour line DETL1, the third detour line DETL3 and the second voltage auxiliary line VSAL may extend in the second direction DR2 and may be formed of the fifth conductive layer CDL5.

In addition, the first dummy lines DML1 aligned with the first detour line DETL1 and the third detour line DETL3 in the second direction DR2 may extend in the second direction DR2 and may be formed of the fifth conductive layer CDL5.

Each of the second detour line DETL2 and the first voltage auxiliary line VDAL may extend in the first direction DR1 and may be formed of the fourth conductive layer CDL4. The second detour line DETL2 and the first voltage auxiliary line VDAL may be arranged alternately in the second direction DR2.

In addition, the second dummy lines DML2 aligned with the second detour line DETL2 in the first direction DR1 may also extend in the first direction DR1, and may be formed of the fourth conductive layer CDL4.

Each of the data output lines DOPL, the first data input line DIPL1 and the main input line MIPL may be formed of the first conductive layer CDL1 on the first gate dielectric layer 122 or the second conductive layer CDL2 on the second gate dielectric layer 123.

The data lines DL may be connected to the data output lines DMOL through data connection holes DCH, respectively.

As shown in FIG. 12, the first detour line DETL1 may be electrically connected to the second detour line DETL2 through the first detour connection hole DETH1 associated with one end of the second detour line DETL2.

The third detour line DETL3 may be electrically connected to the second detour line DETL2 through the second detour connection hole DETH2 associated with another end of the second detour line DETL2.

The third detour line DETL3 may be electrically connected to the detour additional line DEAL through a third detour connection hole DETH3 associated with the one end of the detour additional line DEAL.

According to an embodiment, the detour additional line DEAL may extend in the second direction DR2. Accordingly, the input terminal of the first demux circuit DMC1 connected to the detour additional line DEAL may extend in the first direction DR1 toward the detour additional line DEAL, and thus the input terminal of the first demux circuit DMC1 may have a different shape from the input terminal of the second demux circuit DMC2.

Each of the demux circuits DMC may include the first demux transistor TDM1 and the second demux transistor TDM2.

As shown in FIG. 13, each of the first demux transistor TDM1 and the second demux transistor TDM2 may include a channel region formed of the semiconductor layer SEL, first and second electrodes, and a gate electrode overlapping the channel region.

The gate electrode of the first demux transistor TDM1 may be formed of a part of the first demux control line SCSL1 overlapping with the channel region of the first demux transistor TDM1.

The gate electrode of the second demux transistor TDM2 may be formed of a part of the second demux control line SCSL2 overlapping with the channel region of the second demux transistor TDM2.

At least a part of each of the first voltage supply line VDSPL and the second voltage supply line VSSPL disposed in the non-display area NDA and the first subsidiary area SB1 is disposed in the demux area DMXA. In such an embodiment, the demux circuits DMC disposed in the demux area DMXA may overlap with each of the first voltage supply line VDSPL and the second voltage supply line VSSPL.

Each of the first voltage supply line VDSPL and the second voltage supply line VSSPL may have a jumping structure defined by a combination of the third conductive layer CDL3, the fourth conductive layer CDL4 and the fifth conductive layer CDL5.

The second voltage auxiliary line VSAL may branch off from the second voltage supply line VSSPL of the fifth conductive layer CDL5. In such an embodiment, a part of the first voltage supply line VDSPL crossing the second voltage auxiliary line VSAL may be formed of the third conductive layer CDL3 or the fourth conductive layer CDL4.

The first demux control line SCSL1 and the second demux control line SCSL2 may be formed of the third conductive layer CDL3.

It should be noted that this is merely illustrative. The arrangement structure of the first voltage supply line VDSPL, the second voltage supply line VSSPL, the first demux control line SCSL1 and the second demux control line SCSL2 may be modified in a variety of ways as long as the first voltage supply line VDSPL, the second voltage supply line VSSPL, the first demux control line SCSL1 and the second demux control line SCSL2 are insulated from the data output lines DMOL and data input lines DIPL.

In addition, each of the first demux control line SCSL1 and the second demux control line SCSL2 may be disposed with a jumping structure defined by a combination of the third conductive layer CDL3 and the fourth conductive layer CDL4.

In addition, a constant voltage supply line CVL disposed in the non-display area NDA and extended from the first subsidiary area SB1 to the scan driver circuit area SDCA may be disposed with a jumping structure defined by the combination of the third conductive layer CDL3 and the fourth conductive layer CDL4.

In such an embodiment, the first voltage supply line VDSPL, the second voltage supply line VSSPL, the first demux control line SCSL1, the second demux control line SCSL2 and the constant voltage supply line CVL may be insulated from one another and integrated in the non-display area NDA, so that the width of the non-display area NDA can be reduced.

The display device 10 may further include a dam structure DAMS disposed in the non-display area NDA to surround the display area DA.

The second encapsulation layer 142 of the encapsulation structure layer 140 may be disposed in a way such that the second encapsulation layer 142 is surrounded by the dam structure DAMS.

Figure 14:
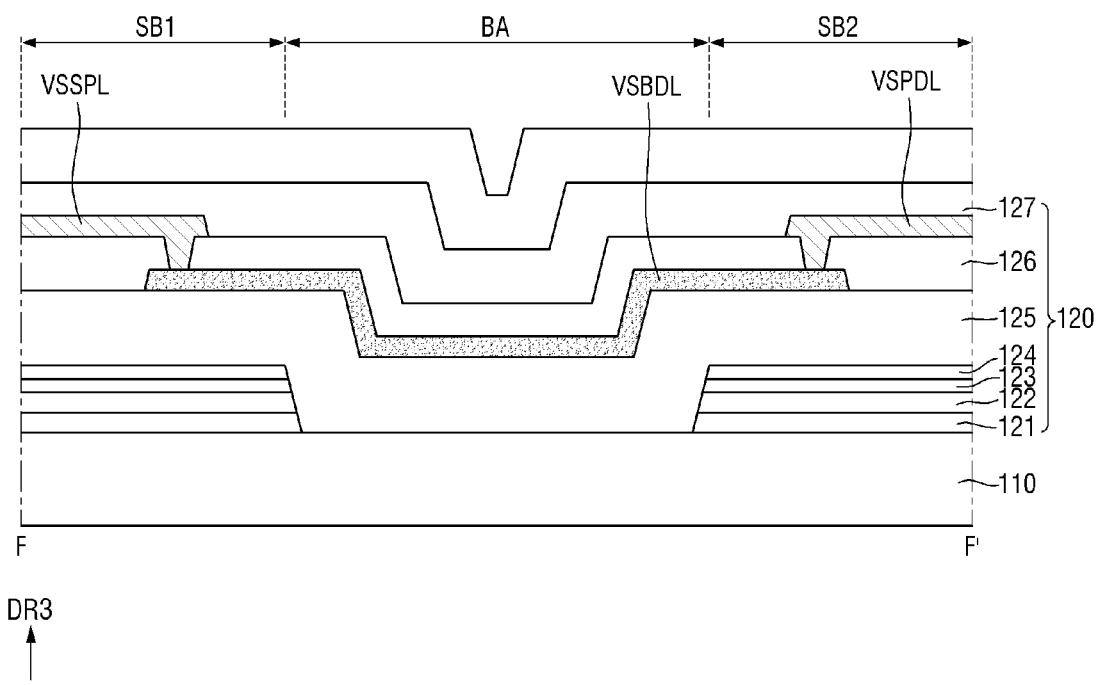
FIG. 14 is a cross-sectional view showing an example, taken along line F-F' of FIG. 5.

FIG. 14 is a cross-sectional view showing an example, taken along line F-F' of FIG. 5.

The bending area BA of the subsidiary area SBA may be changed into a bent shape. When the bending area BA is changed into such a bent shape, an inorganic film may be vulnerable to cracking due to bending stress. Therefore, a part of each of the buffer layer 121, the first gate dielectric layer 122, the second gate dielectric layer 123, and the interlayer dielectric layer 124 including or made of the inorganic film that is associated with the bending area BA may be removed.

Accordingly, lines of the bending area BA may be separately disposed to connect the lines of the first subsidiary area BA1 with the lines of the second subsidiary area BA2.

Referring to FIG. 14, at least a part of the second voltage supply line VSSPL of the non-display area NDA and the first subsidiary area SBA1, and at least a part of the second voltage pad line VSPDL of the second subsidiary area SBA2 may be formed of the fifth conductive layer CDL5 on the second planarization layer.

In addition, the second voltage bending line VSBDL of the bending area BA connected between the second voltage supply line VSSPL and the second voltage pad line VSPDL may be formed of the fourth conductive layer CDL4 on the first planarization layer 125. It should be noted that this is merely illustrative. Each of the lines of the bending area BA may be formed of a conductive layer disposed on at least one selected from the first planarization layer 125, the second planarization layer 126 and the third planarization layer 127.

In addition, although not shown in the drawings, each of the first voltage supply line VDSPL of the non-display area NDA and the first subsidiary area SBA1 and the first voltage pad line VDPDL of the second subsidiary area SBA2 may be formed of the fifth conductive layer on the second planarization layer 126, and the first voltage bending line VDBDL may be formed of the fourth conductive layer CDL4 on the first planarization layer 125.

The organic film and the lines of the sensor electrode layer 150 may extend to the bending area BA and the second subsidiary area SB2.

Figure 15:
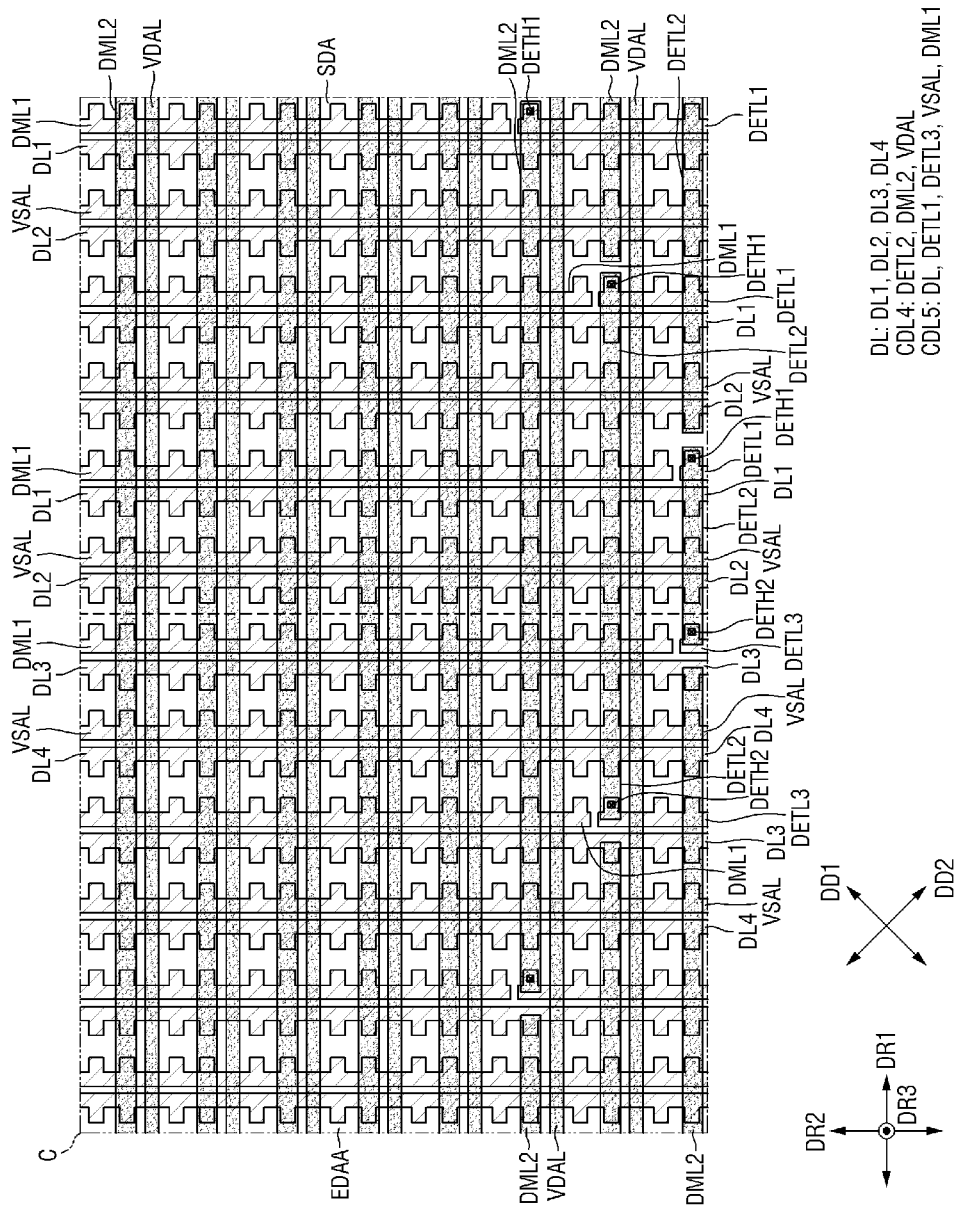
FIG. 15 is a plan view showing an example of the fourth conductive layer and the fifth conductive layer in portion C of FIG. 4 according to an embodiment.
Figure 16:
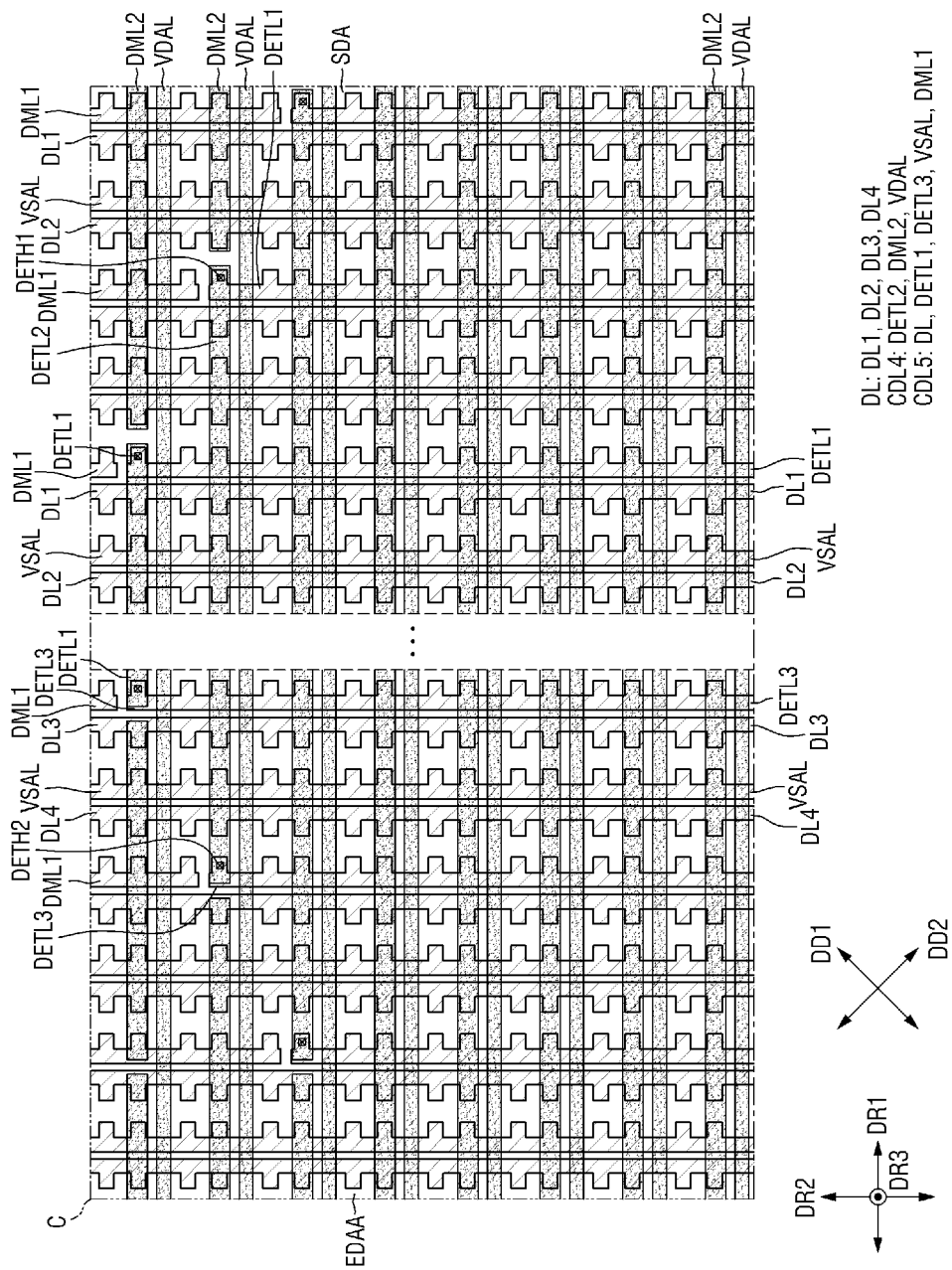
FIG. 16 is a plan view showing another example of the fourth conductive layer and the fifth conductive layer in portion C of FIG. 4 according to an embodiment.

FIG. 15 is a plan view showing an example of the fourth conductive layer and the fifth conductive layer in portion C of FIG. 4 according to an embodiment. FIG. 16 is a plan view showing another example of the fourth conductive layer and the fifth conductive layer in portion C of FIG. 4 according to an embodiment.

FIGS. 15 and 16 show a part of the center adjacent area CDAA and a part of the edge adjacent area EDAA of the display area DA which are adjacent to the boundary between the center adjacent area CDAA and the edge adjacent area EDAA.

Referring to FIGS. 15 and 16, the first data line DL1 and the second data line DL2 connected to the first demux circuit DMC1 are disposed in the center adjacent area CDAA.

In the center adjacent area CDAA, the first data line DL1 may be adjacent to the first detour line DETL1, and the second data line DL2 may be adjacent to the second voltage auxiliary line VSAL. In such an embodiment, the first data line DL1 may be closer to the first detour line DETL1 than the second voltage auxiliary line VSAL, and the second data line DL2 may be closer to the second voltage auxiliary line VSAL than the first detour line DELT1. In such an embodiment, in the center adjacent area CDAA, the first detour line DETL1, the first data line DL1, the second voltage auxiliary line VSAL, and the second data line DL2 may be arranged repeatedly toward one side in the first direction DR1.

The third data line DL3 and the fourth data line DL4 connected to the second demux circuit DMC2 are disposed in the edge adjacent area EDAA.

In the edge adjacent area EDAA, the third data line DL3 may be adjacent to the third detour line DETL3, and the fourth data line DL4 may be adjacent to the second voltage auxiliary line VSAL. In such an embodiment, the third data line DL3 may be closer to the third detour line DETL3 than the second voltage auxiliary line VSAL, and the fourth data line DL4 may be closer to the second voltage auxiliary line VSAL than the third detour line DELT3. In such an embodiment, in the edge adjacent area EDAA, the third detour line DETL3, the third data line DL3, the second voltage auxiliary line VSAL, and the fourth data line DL4 may be arranged repeatedly toward the one side in the first direction DR1.

One side of the second detour line DETL2 is connected to the first detour line DETL1 through the first detour connection hole DETH1 in the center adjacent area CDAA, and another side of the second detour line DETL2 is connected to the third detour line DETL3 through the second detour connection hole DETH2 in the edge adjacent area EDAA.

The first voltage auxiliary line VDAL may extend in the first direction DR1 and may be arranged alternately with the second detour line DETL2 in the second direction DR2.

The first dummy lines DML1 are spaced apart from one side of the first detour line DETL1 in the second direction DR2 and one side of the third detour line DETL3 in the second direction DR2 and may be extended in the second direction DR2.

The second dummy lines DML2 are aligned with the second detour line DETL2, are spaced apart from both sides of the second detour line DETL2 in the first direction DR1 and extend in the first direction DR1.

As shown in FIG. 15, the first detour connection holes DETH1 of the second detour lines DETL2 adjacent in the second direction DR2 may be arranged in a first diagonal direction DD1.

The second detour connection holes DETH2 of the second detour lines DETL2 adjacent in the second direction DR2 may be arranged in a second diagonal direction DD2.

In such an embodiment, the length of the second detour lines DETL2 may increase as being away from the demux area DMXA in the second direction DR2.

Alternatively, as shown in FIG. 16, the first detour connection holes DETH1 of the second detour lines DETL2 adjacent in the second direction DR2 may be arranged in the second diagonal direction DD2.

The second detour connection holes DETH2 of the second detour lines DETL2 adjacent in the second direction DR2 may be arranged in the first diagonal direction DD1.

In such an embodiment, the length of the second detour lines DETL2 may decrease as being away from the demux area DMXA in the second direction DR2.

In such an embodiment, it is possible to easily determine whether the first detour connection holes DETH1 and the second detour connection holes DETH2 are normally arranged based on the arrangement shape of the first detour connection holes DETH1 and the arrangement shape of the second detour connection holes DETH2.

As shown in FIGS. 15 and 16, among the second demux circuits DMC2 disposed in the second demux areas DMXA2, a second demux circuit DMC2 that is farther from the first demux area DMXA1 may be connected to a second data input line DIPL2 including a longer second detour line DETL2.

Figure 17:
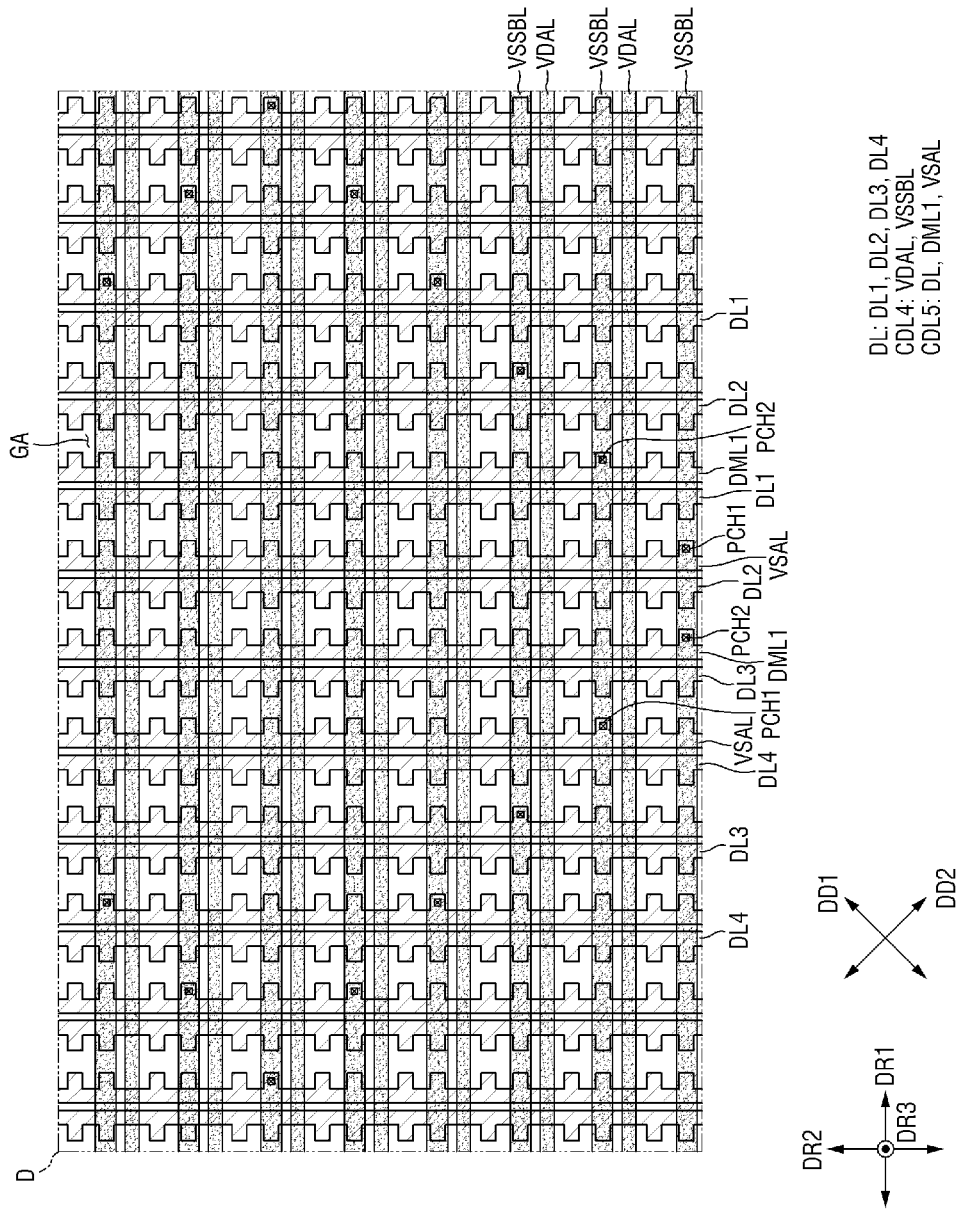
FIG. 17 is a plan view showing an example of the fourth conductive layer and the fifth conductive layer in portion D of FIG. 4 according to an embodiment.

FIG. 17 is a plan view showing an example of the fourth conductive layer and the fifth conductive layer in portion D of FIG. 4 according to an embodiment.

FIG. 17 shows a part of the general area GA that is the remaining area of the display area DA other than the demux adjacent area DAA.

FIG. 17 shows a part of the general area GA which is parallel to some areas of FIGS. and 16 in the second direction DR2.

Referring to FIG. 17, each of the first data line DL1, the second data line DL2, the third data line DL3, the fourth data line DL4, the fourth data line DL4, the first dummy line DML1 and the second voltage auxiliary line VSAL disposed in the demux adjacent area DAA extends in the second direction DR2 and is disposed in the general area GA.

According to an embodiment, the circuit array layer 120 may further include a second voltage sub-line VSSBL that is disposed in the general area GA, is connected to the second voltage auxiliary line VSAL and extends in the first direction DR1.

In the general area GA, the first voltage auxiliary line VDAL is adjacent to the second voltage sub-line VSSBL. In such an embodiment, in the general area GA, the first voltage auxiliary line VDAL and the second voltage sub-line VSSBL may be arranged alternately in the second direction DR2.

The second voltage sub-line VSSBL may be formed of the fourth conductive layer CDL4 on the first planarization layer 125, along with the first voltage auxiliary line VDAL.

The second voltage sub-line VSSBL may be connected to the second voltage auxiliary line VSAL through a first voltage connection hole PCH1.

In addition, the second voltage sub-line VSSBL may be electrically connected to the first dummy line DML1 through a second voltage connection hole PCH2.

Accordingly, the first dummy line DML1 may be electrically connected to the second voltage auxiliary line VSAL through the second voltage sub-line VSSBL, the first voltage connection hole PCH1 and the second voltage connection hole PCH2.

In addition, although not shown in the drawings, the second dummy line DML2 of the demux adjacent area DAA may be electrically connected to the first dummy line DML1 through a predetermined connection hole.

In such an embodiment, the first dummy line DML1 and the second dummy line DML2 for hiding the first demux detour line DETL1, the second demux detour line DETL2 and the third demux detour line DETL3 are not floating but are connected to the second voltage auxiliary line VSAL through the second voltage sub-line VSSBL, such that the RC delay of a second voltage transfer path can be reduced.

In such an embodiment, the first voltage connection holes PCH1 and the second voltage connection holes PCH2 may be alternately arranged side by side in a diagonal direction.

Accordingly, it is possible to relatively easily determine whether the first voltage connection holes PCH1 and the second voltage connection holes PCH2 are normally arranged based on the arrangement shapes of the first voltage connection holes PCH1 and the second voltage connection holes PCH2.

As described above, according to an embodiment, the demux circuits DMC connected between the display driver circuit 200 and the data lines DL are disposed in the demux area DMXA of the non-display area NDA, which is located between the display area DA and the subsidiary area SBA.

Accordingly, since the signal transmission path between the demux circuits DMC and the data lines DL is relatively short, the RC delay of the signals transferred from the demux circuits DMC to the data lines DL can be reduced.

Since the numbers of the data supply lines DSPL, the data bending lines DBDL and the data input lines DIPL are equal to the number of the demux circuits DMC, the distance between the lines disposed in the subsidiary area SBA may be increased, the width of the lines disposed in the subsidiary area SBA may be increased, or the width of the subsidiary area SBA may be reduced.

According to an embodiment, as the demux circuits DMC are disposed in the non-display area NDA, the width of the non-display area NDA may be slightly increased. However, since the demux circuits DMC can be arranged side by side, the second demux areas DMXA2 can be arranged along the corners of the main area MA. In addition, the demux area DMXA may overlap with a part of each of the first voltage supply line VDSPL and the second voltage supply line VSSPL. In such an embodiment, even though the demux circuits DMC are disposed, the width of the non-display area NDA is not substantially increased.

In addition, according to an embodiment, the second data input lines DIPL2 connected to the second demux circuits DMC2 arranged along the corners of the main area MA are not extended from the first subsidiary area SB1 to the second demux areas DMXA2 but detour to the first demux area DMXA1 and the display area DA from the first subsidiary area SB1 to be extended to the second the second demux areas DMXA2.

Accordingly, the second data input lines DIPL2 are not arranged in parallel along the corners of the main area MA, the width of the non-display area NDA can be reduced.

Accordingly, the width of the non-display area NDA can be reduced, such that the ratio of the display area DA to the display surface of the display device 10 can be increased, thereby improving the aesthetic appeal and performance of the display device 10.

Figure 18:
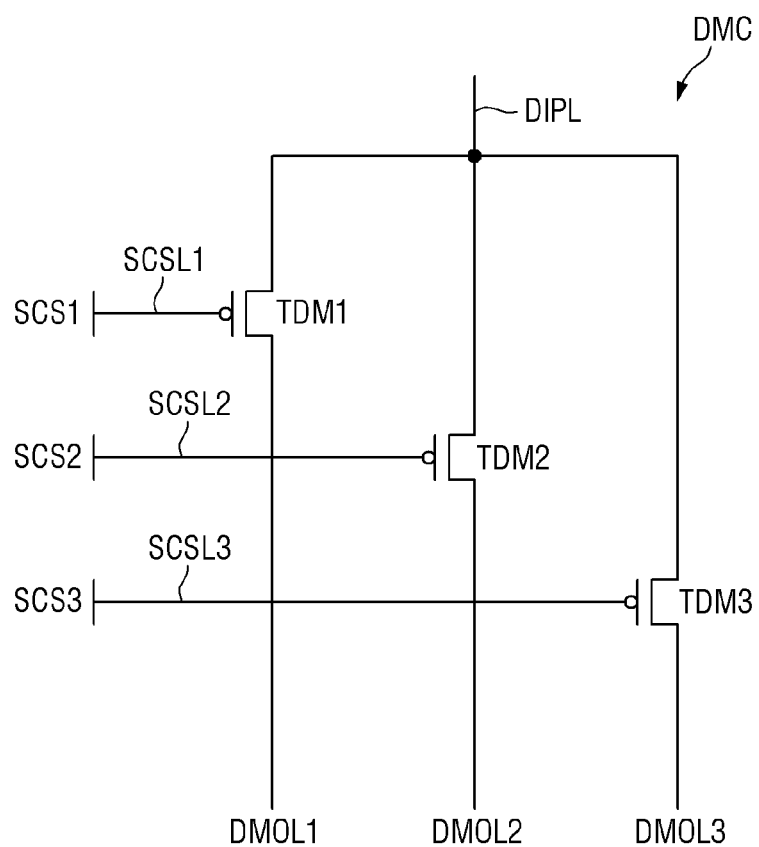
FIG. 18 is an equivalent circuit diagram showing the demux circuit of FIG. 5 according to an alternative embodiment.
Figure 19:
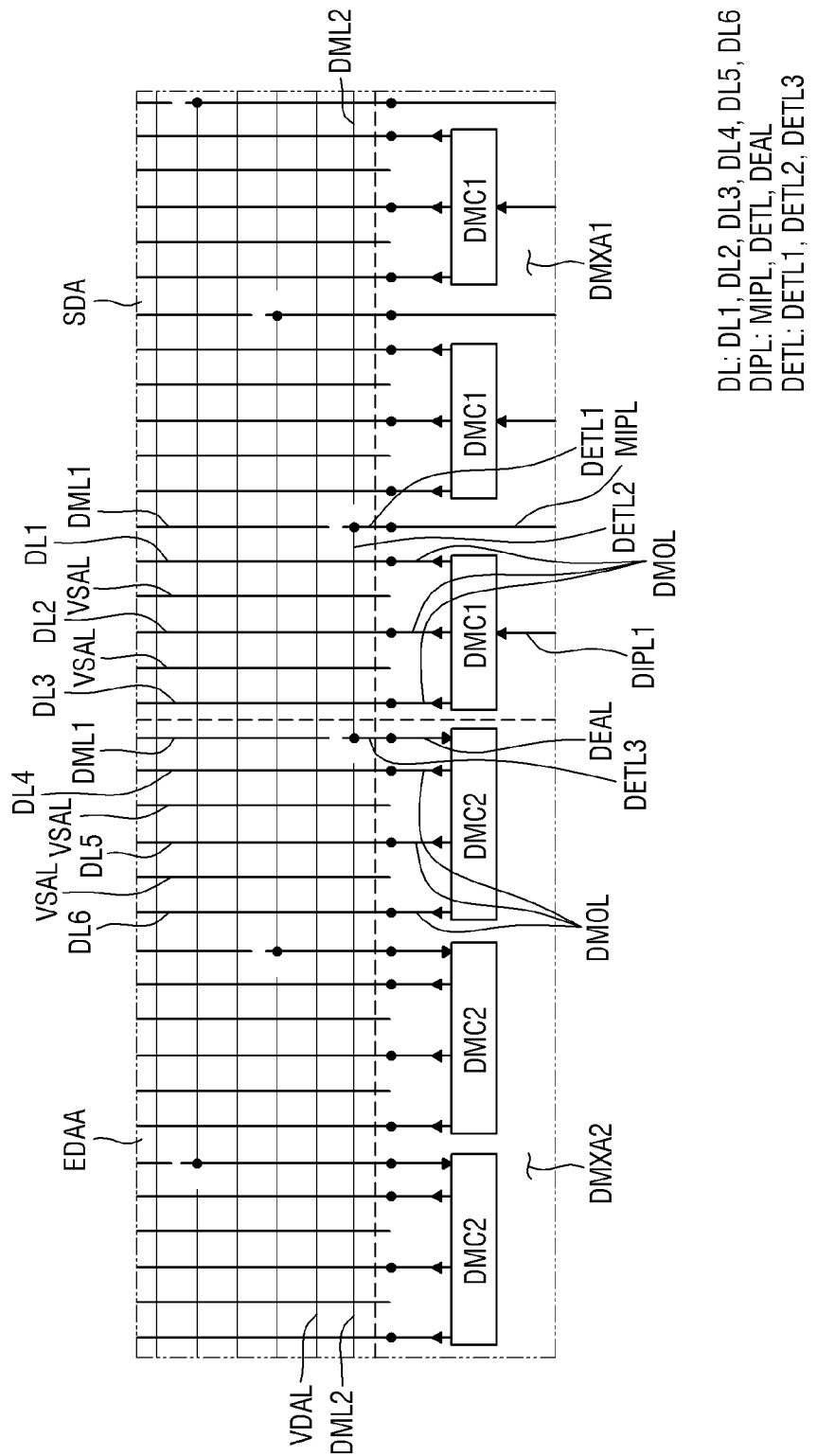
FIG. 19 is a plan view showing a part of each of a display area and a demux area according to the embodiment of FIG. 18.

FIG. 18 is an equivalent circuit diagram showing the demux circuit of FIG. 5 according to an alternative embodiment. FIG. 19 is a plan view showing a part of each of a display area and a demux area according to the embodiment of FIG. 18.

The embodiment of FIGS. 18 and 19 is substantially identical to the embodiment of FIG. 11 except that each of demux circuits DMC in a display device includes three output terminals instead of two output terminals; and, therefore, any repetitive detailed descriptions of the same or like elements of FIGS. 18 and 19 as those described above will be omitted.

Referring to FIG. 18, the demux circuit DMC according to an embodiment includes a first demux transistor TDM1 connected between a data input line DIPL and a first data output line DMOL1, a second demux transistor TDM2 connected between the data input line DIPL and a second data output line DMOL2, and a third demux transistor TDM3 connected between the data input line DIPL and a third data output line DMOL3.

In an embodiment, for example, the first electrode (e.g., the source electrode) of each of the first demux transistor TDM1, the second demux transistor TDM2 and the third demux transistor TDM3 may be connected to the data input line DIPL. In such an embodiment, second electrodes (e.g., drain electrodes) of the first demux transistor TDM1, the second demux transistor TDM2 and the third demux transistor TDM3 may be connected to data output lines DMOL.

The gate electrode of the first demux transistor TDM1 may be connected to a first demux control line SCSL1 for transmitting a first demux control signal SCS1.

The gate electrode of the second demux transistor TDM2 may be connected to a second demux control line SCSL2 for transmitting a second demux control signal SCS2 having a phase different from that of the first demux control signal SCS1.

The gate electrode of the third demux transistor TDM3 may be connected to a third demux control line SCSL2 for transmitting a third demux control signal SCS3 having a phase different from that of the first demux control signal SCS1 or the second demux control signal SCS3.

Referring to FIG. 19, the data lines DL according to an embodiment may include a first data line DL1, a second data line DL2 and a third data line DL3 connected to the first demux circuit DMC1 and disposed in the center adjacent area CDAA, and a fourth data line DL4, a fifth data line DL5 and a sixth data line DL6 connected to the second demux circuit DMC2 and disposed in the edge adjacent area EDAA.

One of the first data line DL1, the second data line DL2 and the third data line DL3 connected to the first demux circuit DMC1 (e.g., the first data line DL1) may be adjacent to a first detour line DETL1, and each of the others (e.g., the second data line DL2 and the third data line DL3) may be adjacent to a second voltage auxiliary line VSAL.

In addition, one of the fourth data line DL4, the fifth data line DL5 and the sixth data line DL6 connected to the second demux circuit DMC2 (e.g., the fourth data line DL4) may be adjacent to a third detour line DETL3, and each of the others (e.g., the fifth data line DL5 and the sixth data line DL6) may be adjacent to the second voltage auxiliary line VSAL.

It should be understood, however, that the embodiments described above are merely illustrative. Alternatively, each of the demux circuits DMC may be electrically connected to four or more data lines as long as the demux circuits DMC can generate data driving signals.

Figure 20:
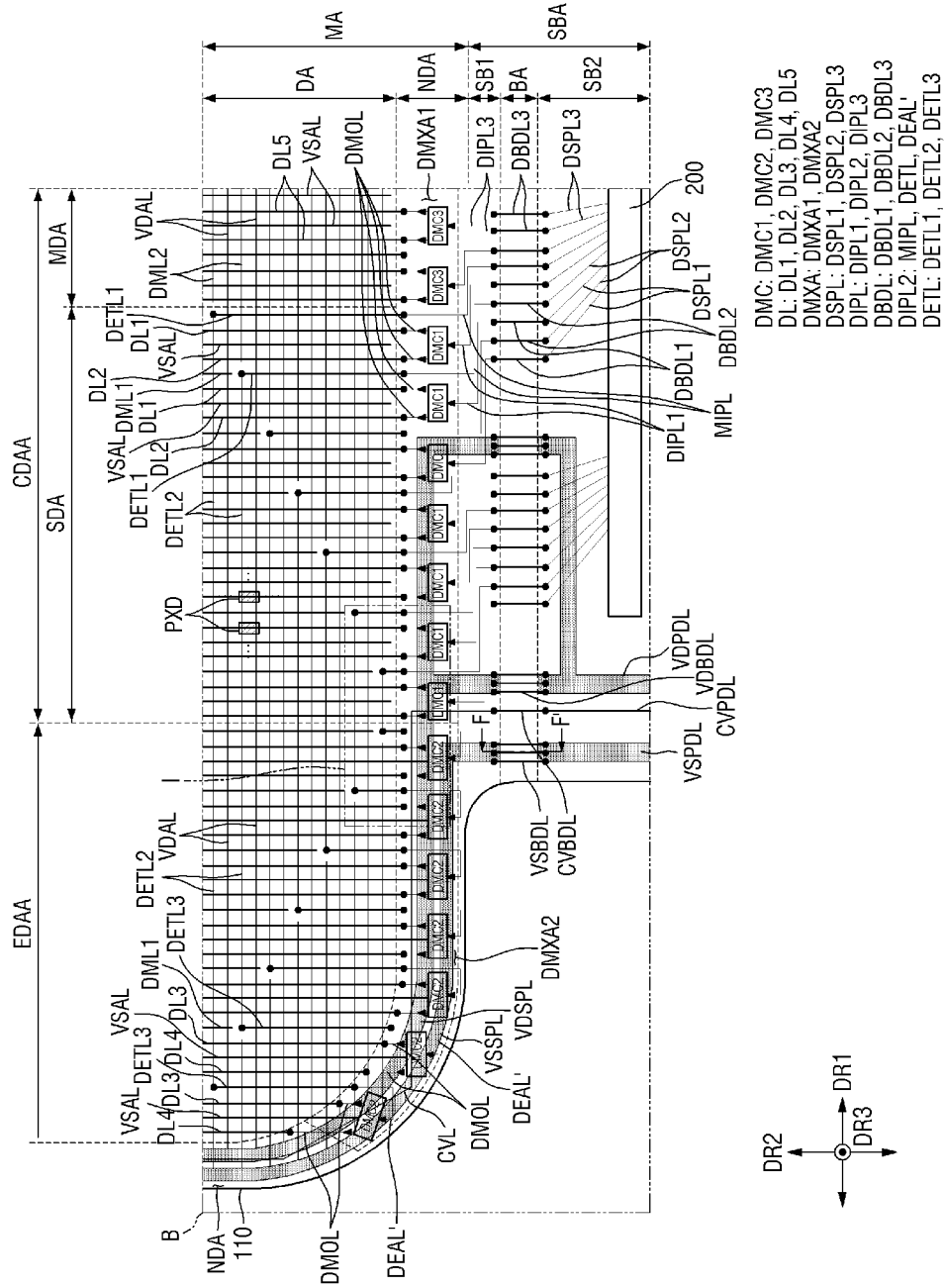
FIG. 20 is a plan view showing portion B of FIG. 4 according to another alternative embodiment.
Figure 21:
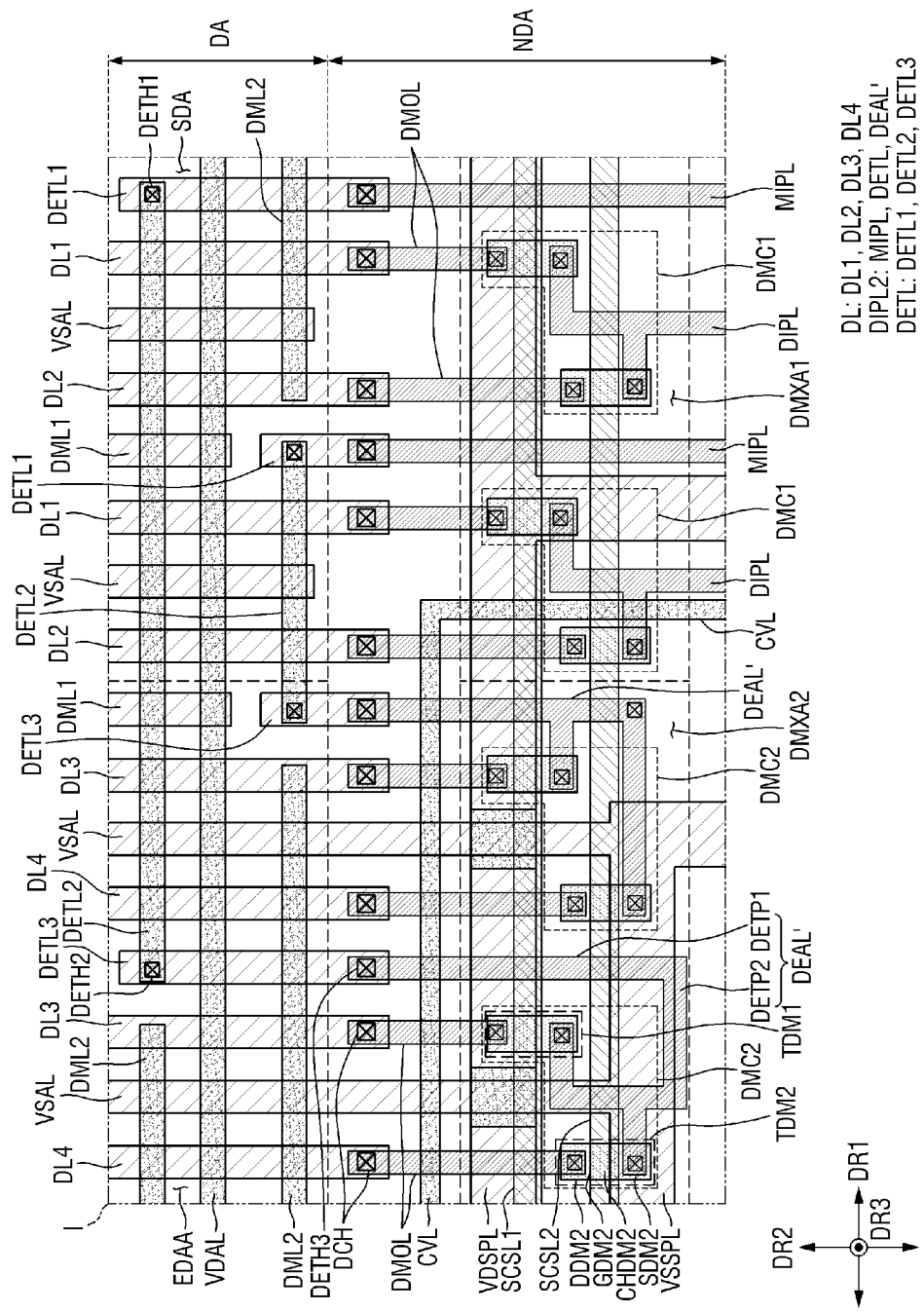
FIG. 21 is a plan view showing an example of portion I of FIG. 20.

FIG. 20 is a plan view showing portion B of FIG. 4 according to another alternative embodiment. FIG. 21 is a plan view showing an example of portion I of FIG. 20.

A display device 10 according to an embodiment of FIGS. 20 and 21 is substantially to the same as the display device according to an embodiment of FIGS. 5 to 17 except that a detour additional line DEAL' includes a first extended portion DETP1 extending in the second direction DR2 and a second extended portion DETP2 extending in the first direction DR1; and, therefore, any repetitive detailed descriptions of the same or like elements of FIGS. 20 and 21 as those described above will be omitted.

As shown in FIG. 20, a detour additional line DEAL' according to an embodiment includes a first extended portion DETP1 connected to a third detour line DETL3 and extending in the second direction DR2, and a second extended portion DETP2 connected to the first extended portion DETP1 and extending in the first direction DR1 toward an input terminal of a second demux circuit DMC2.

In such an embodiment, the detour additional line DEAL' may include a bent shape.

In such an embodiment, the input terminal of the second demux circuit DMC2 may not be extended in the first direction DR1 toward the detour additional line DEAL', but may be formed in a similar shape to the input terminal of the first demux circuit DMC1.

As a result, a patterning process for forming the demux circuits DMC can become easier, and the area can be utilized more efficiently.

The invention should not be construed as being limited to the embodiments set forth herein. Rather, these embodiments are provided so that this disclosure will be thorough and complete and will fully convey the concept of the invention to those skilled in the art. While the invention has been particularly shown and described with reference to embodiments thereof, it will be understood by those of ordinary skill in the art that various changes in form and details may be made therein without departing from the spirit or scope of the invention as defined by the following claims.

What is claimed is:
1. A display device comprising:
  a substrate comprising a main area and a subsidiary area protruding from one side of the main area, the main area comprises a display area in which a plurality of emission areas is arranged in a first direction and a second direction, and a non-display area disposed around the display area;
  a circuit array layer disposed on the substrate, wherein the circuit array layer comprises a plurality of pixel drivers associated with the plurality of emission areas, respectively, data lines which transmit data signals to the plurality of pixel drivers, and demux circuits disposed in a demux area of the non-display area, wherein the demux area is disposed adjacent to the subsidiary area; and
  a display driver circuit disposed in the subsidiary area of the substrate, wherein the display driver circuit supplies data driving signals associated with the data lines, wherein one demux circuit of the demux circuits outputs two or more data signals based on one data driving signal of the data driving signals supplied by the display driver circuit, wherein the demux circuits comprise a first demux circuit disposed in a first demux area of the demux area which is adjacent to the subsidiary area, and a second demux circuit disposed in a second demux area of the demux area which is adjacent to one side of the first demux area in the first direction, wherein the circuit array layer further comprises:
 a first data input line extending from the subsidiary area to the first demux area and electrically connected to an input terminal of the first demux circuit; and
 a second data input line electrically connected to an input terminal of the second demux circuit, and wherein the second data input line comprises:
 a main input line extending from the subsidiary area to the first demux area;
 a demux detour line disposed in the display area and electrically connected to the main input line; and
 a detour additional line disposed in the second demux area and electrically connected between the demux detour line and an input terminal of the second demux circuit.

2. The display device of claim 1, wherein the display area comprises a demux adjacent area which is adjacent to the demux area, and wherein the demux detour line comprises:
 a first detour line disposed in a center adjacent area of the demux adjacent area which is adjacent to the first demux area, wherein the first detour line is electrically connected to the main input line and extending in the second direction;
 a second detour line electrically connected to the first detour line and extending in the first direction; and
 a third detour line disposed in an edge adjacent area of the demux adjacent area which is located between the center adjacent area and the non-display area and adjacent to the second demux area, wherein the third detour line is extending in the second direction toward the second demux area, and electrically connected between the second detour line and the detour additional line.

3. The display device of claim 2, wherein the detour additional line is extending in the second direction.

4. The display device of claim 2, wherein the detour additional line comprises:
 a first extended portion electrically connected to the third detour line and extending in the second direction; and
 a second extended portion electrically connected between the first extended portion and the input terminal of the second demux circuit and extending in the first direction.

5. The display device of claim 2, wherein the subsidiary area comprises:
 a bending area bendable into a bent shape,
 a first subsidiary area disposed between the main area and one side of the bending area, and
 a second subsidiary area on an opposite side of the bending area, and wherein the circuit array layer further comprises:
 a first data supply line and a second data supply line, which are disposed in the second subsidiary area and electrically connected to output terminals of the display driver circuit, respectively;
 a first data bending line electrically connected between the first data supply line and the first data input line and disposed in the bending area; and
 a second data bending line electrically connected between the second data supply line and the main input line and disposed in the bending area.

6. The display device of claim 2, further comprising:
 a light-emitting element array layer disposed on the circuit array layer, wherein the light-emitting element array layer comprises a plurality of light-emitting elements associated with the plurality of emission areas, respectively, wherein the data lines are extending in the second direction, wherein the circuit array layer further comprises:
 a first voltage supply line and a second voltage supply line which are disposed in the non-display area and transmit first and second voltages, respectively, for driving the light-emitting elements; and
 a second voltage auxiliary line disposed in the display area and extending in the second direction to be electrically connected to the second voltage supply line, and wherein a part of each of the first voltage supply line and the second voltage supply line overlaps with the demux circuits.

7. The display device of claim 6, wherein one data line of two or more data lines, which are disposed in the center adjacent area and electrically connected to the first demux circuit, is disposed adjacent to the first detour line, and wherein another data line of the two or more data lines is disposed adjacent to the second voltage auxiliary line.

8. The display device of claim 6, wherein one data line of two or more data lines which are disposed in the edge adjacent area and electrically connected to the second demux circuit, is disposed adjacent to the third detour line, and wherein another data line of the two or more data lines is disposed adjacent to the second voltage auxiliary line.

9. The display device of claim 6, wherein the center adjacent area comprises a middle area and a side area between the middle area and the edge adjacent area, and wherein the first demux circuit is disposed in a portion of the first demux area which is adjacent to the side area, wherein the demux circuits further comprise a third demux circuit disposed in another portion of the first demux area which is adjacent to the middle area, and wherein each of two or more data lines disposed in the middle area and electrically connected to the third demux circuit is disposed adjacent to the second voltage auxiliary line.

10. The display device of claim 6, wherein the circuit array layer further comprises:
 a first voltage auxiliary line disposed in the display area, extending in the first direction, and electrically connected to the first voltage supply line; and
 a second voltage sub-line disposed in a general area of the display area, which is the remaining area of the display area except for the demux adjacent area, extending in the first direction, and electrically connected to the second voltage supply line, wherein the first voltage auxiliary line is disposed adjacent to the second detour line in the demux adjacent area, and disposed adjacent to the second voltage sub-line in the general area.

11. The display device of claim 10, wherein the circuit array layer further comprises:

first dummy lines respectively aligned with the first detour line and the third detour line, respectively spaced apart from one side of the first detour line in the second direction and one side of the third detour line in the second direction, and extending in the second direction; and second dummy lines aligned with the second detour line, respectively spaced apart from opposing sides of the second detour line in the first direction, and extending in the first direction.

12. The display device of claim 11, wherein the first dummy lines or the second dummy lines are electrically connected to the second voltage supply line.

13. The display device of claim 11, wherein the circuit array layer comprises:
a semiconductor layer on the substrate;
a first conductive layer on a first gate dielectric layer covering the semiconductor layer;
a second conductive layer on a second gate dielectric layer covering the first conductive layer;
a third conductive layer on an interlayer dielectric layer covering the second conductive layer;
a fourth conductive layer on a first planarization layer covering the third conductive layer;
a fifth conductive layer on a second planarization layer covering the fourth conductive layer; and
a third planarization layer covering the fifth conductive layer,
wherein the data lines, the first detour line, the third detour line, the second voltage auxiliary line, and the first dummy lines are defined by the fifth conductive layer, and
wherein the second detour line, the first voltage auxiliary line, the second dummy lines, and the second voltage sub-line are defined by the fourth conductive layer.

14. The display device of claim 6, wherein each of the demux circuits comprises two or more demux transistors,
wherein gate electrodes of the two or more demux transistors are electrically connected to two or more demux control lines, respectively, and
wherein the two or more demux control lines supply demux control signals of different phases from each other.

15. The display device of claim 13, wherein the light-emitting array layer comprises:
a plurality of anode electrodes disposed on the third planarization layer, associated with the plurality of emission areas, respectively, and electrically connected to the plurality of pixel drivers, respectively;
a pixel-defining layer disposed on the third planarization layer, associated with a non-emission area which is an area between the emission areas, and covering edges of the plurality of anode electrodes;
a plurality of emission material layers associated with the emission areas, respectively, and disposed on the anode electrodes, respectively; and
a cathode electrode associated with the plurality of emission areas, disposed on the pixel-defining layer and the emission material layers and electrically connected to the second voltage supply line,
wherein each of the light-emitting elements comprises an anode electrode and a cathode electrode facing each other, and an emission material layer disposed between the anode electrode and the cathode electrode.

16. A display device comprising:
a substrate comprising a main area and a subsidiary area protruding from one side of the main area, wherein the main area comprises a display area in which a plurality of emission areas is arranged in a first direction and a second direction, and a non-display area disposed around the display area;
a circuit array layer disposed on the substrate, wherein the circuit array layer comprises a plurality of pixel drivers associated with the plurality of emission areas, respectively, data lines which transmit data signals to the plurality of pixel drivers, and demux circuits disposed in a demux area of the non-display area which is adjacent to the subsidiary area;
a display driver circuit disposed in the subsidiary area of the substrate, wherein the display driver circuit supplies data driving signals associated with the data lines; and
a light-emitting array layer disposed on the circuit array layer, wherein the light-emitting array layer comprises a plurality of light-emitting elements associated with the emission areas, respectively,
wherein one demux circuit among the demux circuits outputs two or more data signals based on one data driving signal,
wherein the circuit array layer further comprises a first voltage supply line and a second voltage supply line which are disposed in the non-display area and transmit first and second voltages for driving the light-emitting elements, respectively, and
wherein a portion of each of the first voltage supply line and the second voltage supply line overlaps with the demux circuits.

17. The display device of claim 16, wherein the demux circuits comprise:
a first demux circuit disposed in a first demux area adjacent to the subsidiary area, and
a second demux circuit disposed in a second demux area adjacent to one side of the first demux area in the first direction,
wherein the circuit array layer further comprises:
a first data input line extending from the subsidiary area to the first demux area and electrically connected to an input terminal of the first demux circuit; and
a second data input line electrically connected to an input terminal of the second demux circuit,
wherein the second data input line comprises:
a main input line extending from the subsidiary area to the first demux area;
a demux detour line disposed in the display area and electrically connected to the main input line; and
a detour additional line disposed in the second demux area and electrically connected between the demux detour line and the input terminal of the second demux circuit.

18. The display device of claim 17, wherein the display area comprises a demux adjacent area which is adjacent to the demux area, and
wherein the demux detour line comprises:
a first detour line disposed in a center adjacent area of the demux adjacent area, which is adjacent to the first demux area, electrically connected to the main input line and extending in the second direction;
a second detour line electrically connected to the first detour line and extending in the first direction; and
a third detour line disposed in an edge adjacent area of the demux adjacent area, which is located between the center adjacent area and the non-display area and adjacent to the second demux area, extending in the second direction toward the second demux area, and electrically connected between the second detour line and the detour additional line.

19. The display device of claim 18, wherein the detour additional line is extending in the second direction.

20. The display device of claim 18, wherein the detour additional line comprises:
   a first extended portion electrically connected to the third detour line and extending in the second direction; and
   a second extended portion electrically connected between the first extended portion and the input terminal of the second demux circuit and extending in the first direction.

21. The display device of claim 18, wherein the circuit array layer further comprises a second voltage auxiliary line disposed in the display area, extending in the second direction, and electrically connected to the second voltage supply line,
   wherein one of two or more data lines disposed in the center adjacent area and electrically connected to the first demux circuit is disposed adjacent to the first detour line, and
   wherein the other one of the two or more data lines is disposed adjacent to the second voltage auxiliary line.

22. The display device of claim 18, wherein the circuit array layer further comprises: a second voltage auxiliary line disposed in the display area, extending in the second direction, and electrically connected to the second voltage supply line,
   wherein one of two or more data lines disposed in the edge adjacent area and electrically connected to the second demux circuit is disposed adjacent to the third detour line, and
   wherein the other one of the two or more data lines is disposed adjacent to the second voltage auxiliary line.

23. The display device of claim 18, wherein the circuit array layer further comprises:
   a second voltage auxiliary line disposed in the display area, extending in the second direction, and electrically connected to the second voltage supply line;
   a first voltage auxiliary line disposed in the display area, extending in the first direction, and electrically connected to the first voltage supply line; and
   a second voltage sub-line disposed in a general area of the display area, which is the remaining area of the display area expect for the demux adjacent area, extending in the first direction, and electrically connected to the second voltage supply line,
   wherein the first voltage auxiliary line is disposed adjacent to the second detour line in the demux adjacent area, and disposed adjacent to the second voltage sub-line in the general area.

24. The display device of claim 23, wherein the circuit array layer further comprises:
   first dummy lines respectively aligned with the first detour line and the third detour line, respectively spaced apart from one side of the first detour line in the second direction and one side of the third detour line in the second direction, and extending in the second direction; and
   second dummy lines aligned with the second detour line, respectively spaced apart from opposing sides of the second detour line in the first direction, and extending in the first direction.

25. The display device of claim 24, wherein the first dummy lines or the second dummy lines are electrically connected to the second voltage supply line.

26. The display device of claim 25, wherein the circuit array layer comprises:
   a semiconductor layer on the substrate;
   a first conductive layer on a first gate dielectric layer covering the semiconductor layer;
   a second conductive layer on a second gate dielectric layer covering the first conductive layer;
   a third conductive layer on an interlayer dielectric layer covering the second conductive layer;
   a fourth conductive layer on a first planarization layer covering the third conductive layer;
   a fifth conductive layer on a second planarization layer covering the fourth conductive layer; and
   a third planarization layer covering the fifth conductive layer,
   wherein the data lines, the first detour line, the third detour line, the second voltage auxiliary line, and the first dummy lines are defined by the fifth conductive layer, and
   wherein the second detour line, the first voltage auxiliary line, the second dummy lines, and the second voltage sub-line are defined by the fourth conductive layer.

27. The display device of claim 26, wherein the light-emitting array layer comprises:
   a plurality of anode electrodes disposed on the third planarization layer, associated with the plurality of emission areas, respectively, and electrically connected to the plurality of pixel drivers, respectively;
   a pixel-defining layer disposed on the third planarization layer, associated with a non-emission area between the emission areas and covering edges of the plurality of anode electrodes;
   a plurality of emission material layers associated with the emission areas, respectively, and disposed on the anode electrodes, respectively; and
   a cathode electrode associated with the plurality of emission areas, disposed on the pixel-defining layer and the emission material layers and electrically connected to the second voltage supply line,
   wherein each of the light-emitting elements comprises an anode electrode and a cathode electrode facing each other and an emission material layer between the anode electrode and the cathode electrode.

28. The display device of claim 17, wherein the subsidiary area comprises a bending area bendable into a bent shape, a first subsidiary area disposed between the main area and one side of the bending area, and a second subsidiary area on an opposite side of the bending area, and
   wherein the circuit array layer further comprises:
   a first data supply line and a second data supply line, which are disposed in the second subsidiary area and electrically connected to output terminals of the display driver circuit, respectively;
   a first data bending line electrically connected between the first data supply line and the first data input line and disposed in the bending area; and
   a second data bending line electrically connected between the second data supply line and the main input line and disposed in the bending area.

* * * * *